United States Patent
Ryu

(10) Patent No.: US 10,311,920 B2
(45) Date of Patent: Jun. 4, 2019

(54) APPARATUS AND METHOD FOR CONTROLLING MEMORY DEVICE

(71) Applicant: SK hynix Inc., Gyeonggi-do (KR)

(72) Inventor: Tae-Kyu Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 7 days.

(21) Appl. No.: 15/651,084

(22) Filed: Jul. 17, 2017

(65) Prior Publication Data

US 2018/0158493 A1   Jun. 7, 2018

(30) Foreign Application Priority Data

Dec. 5, 2016  (KR) ........................ 10-2016-0164263

(51) Int. Cl.

| G06F 3/06 | (2006.01) |
|---|---|
| G11C 7/10 | (2006.01) |
| G11C 7/14 | (2006.01) |
| G06F 11/08 | (2006.01) |
| G06F 11/10 | (2006.01) |
| G11C 11/56 | (2006.01) |
| G11C 16/04 | (2006.01) |
| G11C 16/26 | (2006.01) |

(Continued)

(52) U.S. Cl.
CPC ............ *G11C 7/1006* (2013.01); *G06F 3/064* (2013.01); *G06F 3/0619* (2013.01); *G06F 11/08* (2013.01); *G06F 11/1048* (2013.01); *G11C 7/14* (2013.01); *G11C 11/5642* (2013.01); *G11C 16/0483* (2013.01); *G11C 29/021* (2013.01); *G11C 29/028* (2013.01); *G11C 29/42* (2013.01); *G11C 29/50* (2013.01); *G11C 29/52* (2013.01); *G11C 16/26* (2013.01); *G11C 29/50004* (2013.01); *G11C 2029/0409* (2013.01); *G11C 2029/0411* (2013.01); *G11C 2211/5634* (2013.01)

(58) Field of Classification Search
CPC ..... G11C 7/1006; G11C 29/52; G11C 29/028; G11C 16/26; G11C 29/50; G11C 7/14; G11C 11/5642; G11C 29/42; G11C 29/021; G11C 29/50004; G11C 2029/0411; G11C 2029/0409; G11C 2211/5634; G06F 11/08; G06F 3/0619; G06F 3/064

See application file for complete search history.

(56) References Cited

U.S. PATENT DOCUMENTS

| 2013/0016562 | A1* | 1/2013 | Mun ..................... G11C 11/5628 365/185.12 |
|---|---|---|---|
| 2014/0101519 | A1* | 4/2014 | Lee ...................... G06F 11/1068 714/773 |
| 2017/0131904 | A1* | 5/2017 | Rajwade ............... G06F 3/0604 |

FOREIGN PATENT DOCUMENTS

| KR | 1020130057758 | 6/2013 |
|---|---|---|
| KR | 1020130084901 | 7/2013 |

\* cited by examiner

*Primary Examiner* — Thien Nguyen

(74) *Attorney, Agent, or Firm* — IP & T Group LLP

(57) ABSTRACT

An apparatus for controlling a memory device may include: a table storing information of a plurality of read voltages; an error correction unit suitable for correcting an error of read data; and a processor functionally coupled to the RR table and the error correction unit. The processor selects a default read voltage among the plurality of read voltages from the table when a read fail for the memory device is recognized, sets a shift direction of the default read voltage based on the number of read cells of the memory device read by the default read voltage, and controls a read retry operation of (Continued)

the memory device based on at least one read voltage in the set shift direction in the table.

20 Claims, 17 Drawing Sheets

(51) Int. Cl.
*G11C 29/02* (2006.01)
*G11C 29/04* (2006.01)
*G11C 29/42* (2006.01)
*G11C 29/50* (2006.01)
*G11C 29/52* (2006.01)

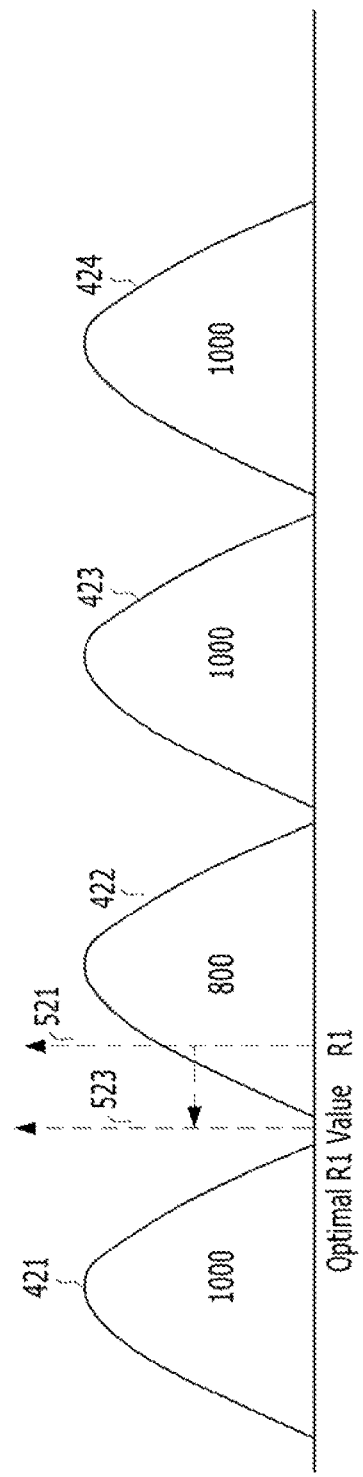

FIG. 6

| MLC WL Group1 (WL 0 ~ WL 11 : Page 0 ~ page 95 ) | | | | | | | | | |
|---|---|---|---|---|---|---|---|---|---|
| EW | EW0K ~ EW1K | | | EW1K ~ EW2K | | | EW2K ~ EW3K | | |
| Reg. | R1 | R2 | R3 | R1 | R2 | R3 | R1 | R2 | R3 |
| Addr | 0x05 | 0x06 | 0x07 | 0x05 | 0x06 | 0x07 | 0x05 | 0x06 | 0x07 |
| RR0 | 0x00 | 0x00 | 0x00 | 0x00 | 0x00 | 0x00 | 0x00 | 0x00 | 0x00 |
| RR1 | 0xF8 | 0x04 | 0xFA | 0xF8 | 0x04 | 0xFA | 0xF8 | 0x04 | 0xFA |
| RR2 | 0xF0 | 0xFA | 0xF2 | 0xF0 | 0xFA | 0xF2 | 0xF0 | 0xFA | 0xF2 |
| RR3 | 0x08 | 0xF4 | 0x0A | 0x08 | 0xF4 | 0x0A | 0x08 | 0xF4 | 0x0A |
| RR4 | 0x08 | 0x0C | 0x02 | 0x08 | 0x0C | 0x02 | 0x08 | 0x0C | 0x02 |
| RR5 | 0x00 | 0x00 | 0xF2 | 0x00 | 0x00 | 0xF2 | 0x00 | 0x00 | 0xF2 |
| RR6 | 0xF8 | 0x08 | 0xEE | 0xF8 | 0x08 | 0xEE | 0xF8 | 0x08 | 0xEE |
| RR7 | 0xF0 | 0xEE | 0xE2 | 0xF0 | 0xEE | 0xE2 | 0xF0 | 0xEE | 0xE2 |
| RR8 | 0x08 | 0x02 | 0xFA | 0x08 | 0x02 | 0xFA | 0x08 | 0x02 | 0xFA |
| RR9 | 0x00 | 0x06 | 0x0A | 0x00 | 0x06 | 0x0A | 0x00 | 0x06 | 0x0A |
| RR10 | 0x00 | 0x0A | 0x02 | 0x00 | 0x0A | 0x02 | 0x00 | 0x0A | 0x02 |
| RR11 | 0xFC | 0x0E | 0xE6 | 0xFC | 0x0E | 0xE6 | 0xFC | 0x0E | 0xE6 |
| RR12 | 0xFC | 0x10 | 0x0A | 0xFC | 0x10 | 0x0A | 0xFC | 0x10 | 0x0A |
| RR13 | 0xFC | 0x12 | 0x02 | 0xFC | 0x12 | 0x02 | 0xFC | 0x12 | 0x02 |
| RR14 | 0x04 | 0x14 | 0xFA | 0x04 | 0x14 | 0xFA | 0x04 | 0x14 | 0xFA |
| RR15 | 0x04 | 0x16 | 0xF2 | 0x04 | 0x16 | 0xF2 | 0x04 | 0x16 | 0xF2 |
| RR16 | 0x00 | 0xFE | 0xFA | 0x00 | 0xFE | 0xFA | 0x00 | 0xFE | 0xFA |
| RR17 | 0xFC | 0xFC | 0xFA | 0xFC | 0xFC | 0xFA | 0xFC | 0xFC | 0xFA |
| RR18 | 0xFC | 0xF8 | 0xF2 | 0xFC | 0xF8 | 0xF2 | 0xFC | 0xF8 | 0xF2 |
| RR19 | 0xF8 | 0xF6 | 0xFE | 0xF8 | 0xF6 | 0xFE | 0xF8 | 0xF6 | 0xFE |
| RR20 | 0xF8 | 0xF2 | 0xF6 | 0xF8 | 0xF2 | 0xF6 | 0xF8 | 0xF2 | 0xF6 |
| RR21 | 0xF8 | 0xF0 | 0xF2 | 0xF8 | 0xF0 | 0xF2 | 0xF8 | 0xF0 | 0xF2 |
| RR22 | 0xF8 | 0xEC | 0xEA | 0xF8 | 0xEC | 0xEA | 0xF8 | 0xEC | 0xEA |
| RR23 | 0xF4 | 0xEA | 0xEC | 0xF4 | 0xEA | 0xEC | 0xF4 | 0xEA | 0xEC |
| RR24 | 0xF0 | 0xE8 | 0xEA | 0xF0 | 0xE8 | 0xEA | 0xF0 | 0xE8 | 0xEA |
| RR25 | 0xF0 | 0xE6 | 0xF6 | 0xF0 | 0xE6 | 0xF6 | 0xF0 | 0xE6 | 0xF6 |
| RR26 | 0xF0 | 0xE4 | 0xEE | 0xF0 | 0xE4 | 0xEE | 0xF0 | 0xE4 | 0xEE |
| RR27 | 0xF0 | 0xE2 | 0xEA | 0xF0 | 0xE2 | 0xEA | 0xF0 | 0xE2 | 0xEA |
| RR28 | 0x00 | 0xE0 | 0xE8 | 0x00 | 0xE0 | 0xE8 | 0x00 | 0xE0 | 0xE8 |
| RR29 | 0xF8 | 0xDE | 0xE2 | 0xF8 | 0xDE | 0xE2 | 0xF8 | 0xDE | 0xE2 |
| RR30 | 0xDC | 0xDC | 0xDD | 0xDC | 0xDC | 0xDD | 0xDC | 0xDC | 0xDD |
| RR31 | 0xDC | 0xDA | 0xD2 | 0xDC | 0xDA | 0xD2 | 0xDC | 0xDA | 0xD2 |

APPARATUS AND METHOD FOR CONTROLLING MEMORY DEVICE

CROSS-REFERENCE TO RELATED APPLICATIONS

The present application claims priority of Korean Patent Application No. 10-2016-0164263, filed on Dec. 5, 2016, which is incorporated herein by reference in its entirety.

BACKGROUND

1. Field

Exemplary embodiments of the present invention relate to an apparatus and method for controlling a memory device, and more particularly, to an apparatus and method for controlling an operation based on a read fail of a memory device.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory or an auxiliary memory of a portable electronic device.

A memory device has excellent stability and durability because it does not include a mechanical driving unit. Also, the memory device is advantageous in that it may access data quickly and consume a small amount of power. Non-limiting examples of a memory device having these advantages include a universal serial bus (USB) memory device, a memory card with diverse interfaces, and a solid state drive (SSD).

A memory device can correct an error which occurs during a read operation. However, the number of correctable error bits may be limited. The memory device cannot correct an error when the number of error bits which occurs during a read operation exceeds the number of correctable error bits (i.e., read fail). When the read fail occurs, the memory device may perform a read retry operation while changing a read voltage level based on a read retry (RR) table. The RR table may include a plurality of read voltage information. The memory device may perform a read retry operation based on the sequence of the read voltage information of the RR table. Therefore, during a read retry operation, the memory device can perform a large number of read operations based on the RR table. In order to reduce the number of read retry operations, the memory device may perform the read retry operations using some of the read voltages of the RR table. However, existing read retry operations tend to excessively increase the overhead of the memory device.

SUMMARY

Various embodiments are directed to an apparatus and method for a read retry operation for a memory device. When a read fail occurs, the apparatus and method can estimate a direction to shift a read voltage capable for removing the read fail, set read voltages capable of correcting a read error in the estimated direction in a read retry (RR) table, and perform a read retry operation.

Various embodiments are directed to an apparatus and method for controlling a memory device, which can set a direction to select read voltages in a read retry (RR) table based on the number of cells for each of program and verify voltages which are acquired through a default voltage of the RR table, when a read fail occurs, and perform a read retry operation using read voltages in the set direction.

Various embodiments are directed to an apparatus and method for controlling a memory device, which includes a read retry (RR) table corresponding to multi-level cells, selects a default voltage corresponding to a page in which a read fail from the RR table when the read fail occurred, sets a direction to select read voltages in the RR table based on the number of cells for each of program and verify voltages which are acquired through the selected default voltage, and performs a read retry operation using read voltages in the set direction.

In an embodiment, an apparatus for controlling a memory device may include: a table storing information of a plurality of read voltages; an error correction unit suitable for correcting an error of read data; and a processor functionally coupled to the table and the error correction unit. The processor selects a default read voltage among the plurality of read voltages from the table when a read fail for the memory device is recognized, sets a shift direction of the default read voltage based on the number of read cells of the memory device read by the default read voltage, and controls a read retry operation of the memory device based on at least one read voltage in the set shift direction in the table.

In an embodiment, a method for controlling a memory device may include: selecting a default read voltage from a table storing information of a plurality of read voltages when a read fail for the memory device is recognized; setting a shift direction of the default read voltage based on the number of read cells of the memory device read by the default read voltage; and controlling a read retry operation of the memory device, based on at least one read voltage in the set shift direction in the table.

BRIEF DESCRIPTION OF THE DRAWINGS

FIGS. 5A to 5C are diagrams illustrating a method for setting the index sequence of a read retry (RR) table using a cell count in accordance with various embodiments of the present invention.

FIG. 6 is a diagram illustrating an example of a read retry (RR) table for multi-level cell (MLC)-type memory cells;

DETAILED DESCRIPTION

Figure 1:
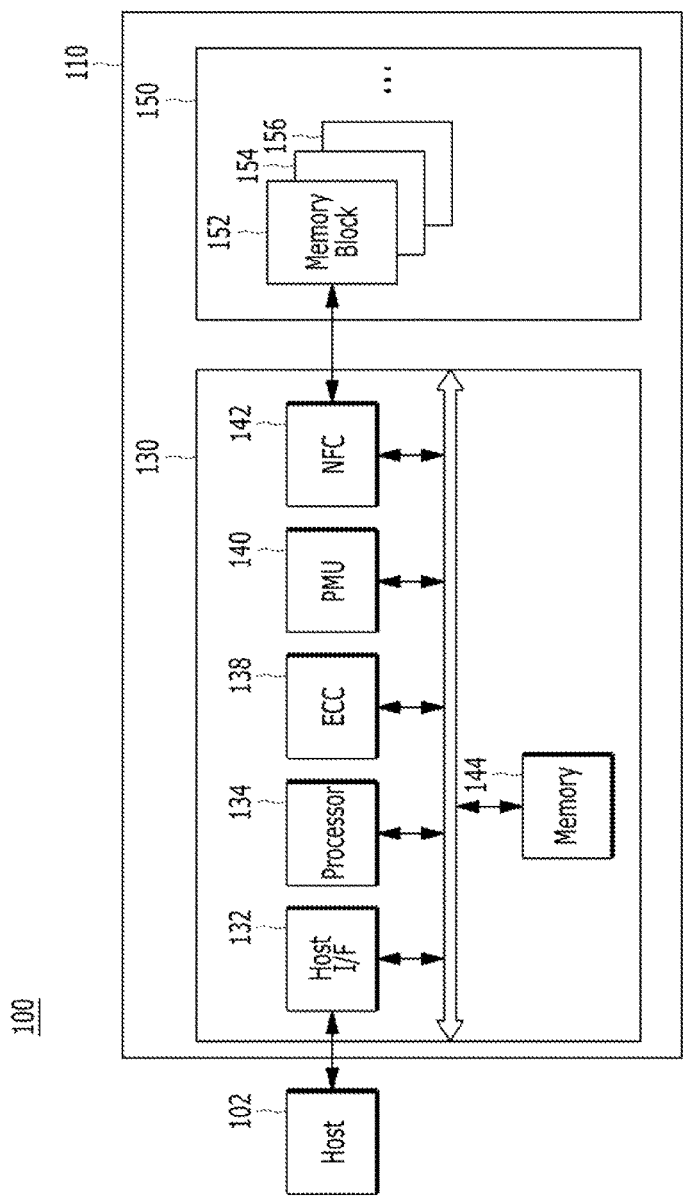
FIG. 1 is a block diagram illustrating a data processing system including a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in same instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as corn only understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereafter, various embodiments will be described in more detail with reference to the accompanying drawings.

FIG. 1 illustrates a data processing system 100 including a memory system 110, according to an embodiment of the present invention.

Referring to FIG. 1, the data processing system 100 may include a host 102 operatively coupled to a memory system 110.

The host 102 may be any suitable electronic device. The host 102 may be or include, for example, a portable electronic device such as a mobile phone, an MP3 player and a laptop computer or a non-portable electronic device such as a desktop computer, a game player, a television (TV) and a projector.

The memory system 110 may operate in response to a request from the host 102. For example, the memory system 110 may store data provided by the host 102 and the memory system 110 may also provide stored data to the host 102. Data which are stored in the memory system may be accessed by the host 102. The memory system 110 may be used as a main memory or an auxiliary memory of the host 102. The memory system 110 may be implemented with any one of various storage devices, according to the protocol of a host interface to be coupled electrically with the host 102. The memory system 110 may be implemented with any one of various storage devices, such as a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices forming the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (SCRAM) and a flash memory.

The memory system 110 may include a memory device 150 and a controller 130. The memory device 150 may store data which may be accessed by the host 102. The controller 130 may control data exchange between the memory device 150 and the host 102. For example, under the control of the controller 130, data received from the host may be stored in the memory device 150, and stored data in the memory device 150 may be read and transmitted to the host 102.

The controller 130 and the memory device 150 may be integrated into one semiconductor device. For instance, the controller 130 and the memory device 150 may be integrated into one semiconductor device to form a solid state drive (SSD).

The controller 130 and the memory device 150 may be integrated into one semiconductor device to form a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

The memory system 110 may include the controller 130 and the memory device 150, which have a hardware structure separated from each other. In this case, the controller 130 may be a main control unit or an auxiliary control unit for an electronic device. The electronic device may be the host 102 or include some function of the host 102. For another instance, the electronic device may be an independent device physically from the host 102. The memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 of the memory system 110 may retain stored data even when power is blocked, store the data provided from the host 102 during a write operation, and provide stored data to the host 102 during a read operation. The memory device 150 may include at least one memory block or a plurality of memory blocks, for example, 152, 154 and 156 in FIG. 1. The memory device 150 may a non-volatile memory device, for example, a flash memory.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program, and erase operations.

For example, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component interconnect express (PCI-e), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than a threshold number of correctable error bits, then may output an error correction fail signal indicating failure in correcting the error bits.

The FCC unit 138 may perform an error correction operation based on any suitable method including a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory. It is noted that a different memory interface may be employed depending upon the type of memory device employed.

The memory 144 may serve as a working memory of the memory system 110 and the controller 130. The memory 144 may store data for driving the memory system 110 and the controller 130. The controller 130 may control the memory device 150 in response to a request from the host 102. For example, the controller 130 may provide data read from the memory device 150 to the host 102 and store the data provided from the host 102 in the memory device 150. When the controller 130 controls an operation of the memory device 150 such as, for example, a read, write, program and erase operation, the memory 144 may store data which are used by the controller 130 and the memory device 150 for the operation.

The memory 144 may be implemented with a volatile memory such as, for example, a static random access memory (SRAM) or a dynamic random access memory (DRAM). As described above, the memory 144 may store data used by the host 102 and the memory device 150 for an operation including a read and a write operation. For storing the data, the memory 144 may include a program memory, a data memory, a write buffer, a read buffer, a map buffer, and the like.

The processor 134 may control the general operations of the memory system 110, and a write operation or a read operation for the memory device 150, in response to a write request or a read request received from the host 102, respectively. For example, the processor 134 may drive firmware, which is referred to as a flash translation layer (FTL), to control the general operations of the memory system 110. The processor 134 may be implemented, for example, with a microprocessor or a central processing unit (CPU).

A method for controlling a memory device (also referred to as a memory control method) in accordance with various embodiments may perform a read retry operation while selecting the indexes of a read retry (RR) table in a variable order, not a fixed order, when a read fail occurs. For this operation the controller 130 of FIG. 1 may transmit default voltage information of the RR table when the read fail is recognized, and read data from the page where the read fail occurred, in the memory device 150. At this time, the controller 130 may check the number of cells read from the page where the read fail occurred, determine a direction to shift the default voltage (for example, negative direction or positive direction) based on the number of memory cells, and then perform a read retry operation using only read voltage information in the determined shift direction in the RR table. In the following descriptions, "negative direction" may refer to a direction to decrease or lower the read voltage (e.g., a direction to shift a read voltage to the left side in the RR table), and "positive direction" may refer to a direction to increase or raise the read voltage (e.g., a direction to shift a read voltage to the right side in the RR table). For example, the RR table may store indexes which are alternately mapped to information capable of increasing the read voltage and information capable of decreasing the read voltage. In this case, when the positive direction is set, the controller 130 may select read voltage information in the direction where the read voltage becomes higher than the default voltage in the RR table. On the other hand, when the negative direction is set, the controller 130 may select read voltage information in the direction where the read voltage becomes lower than the default voltage in the RR table.

Figure 2A:
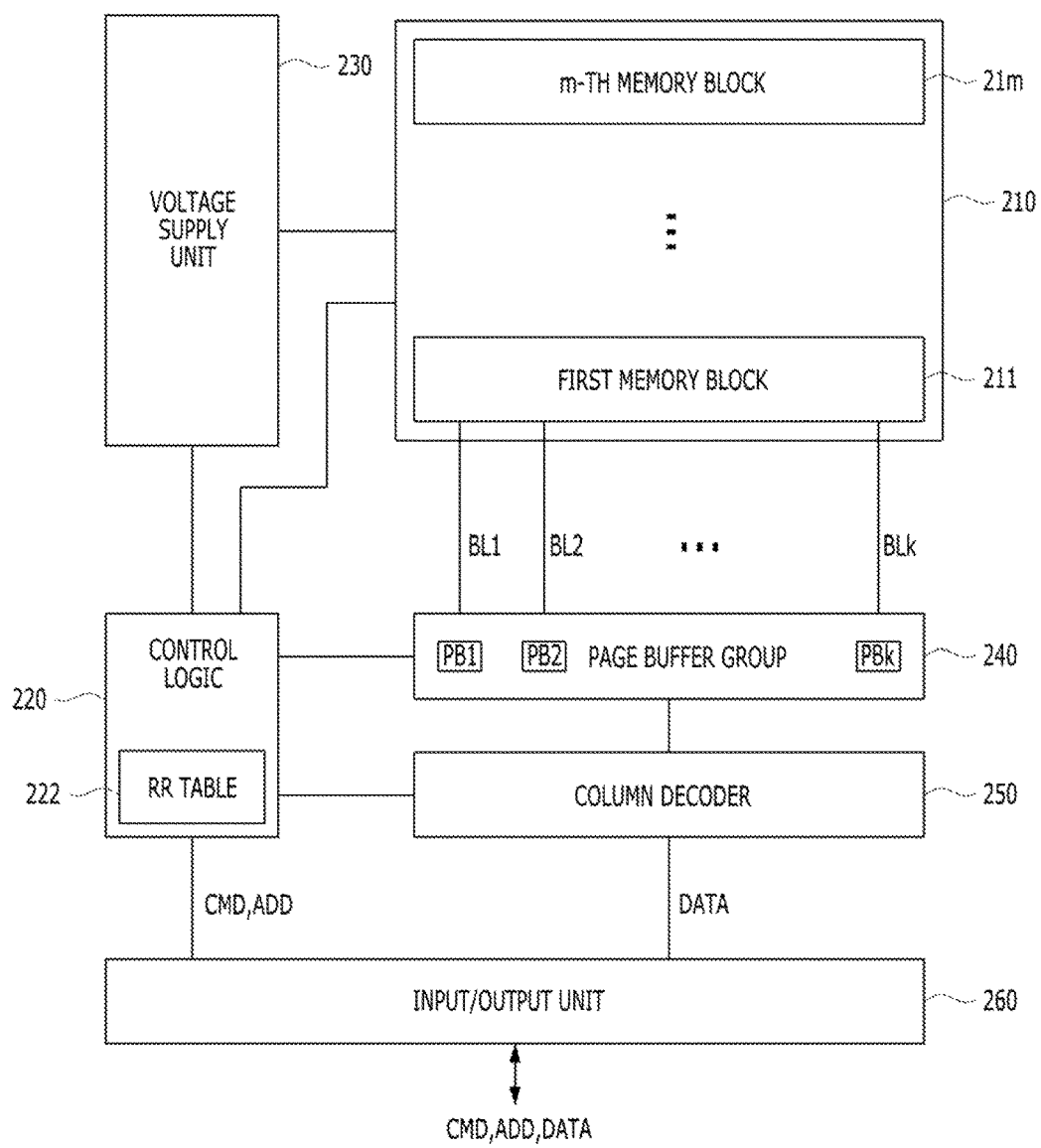
FIG. 2A is a block diagram illustrating a configuration of a memory device in accordance with various embodiments of the present invention.
Figure 2B:
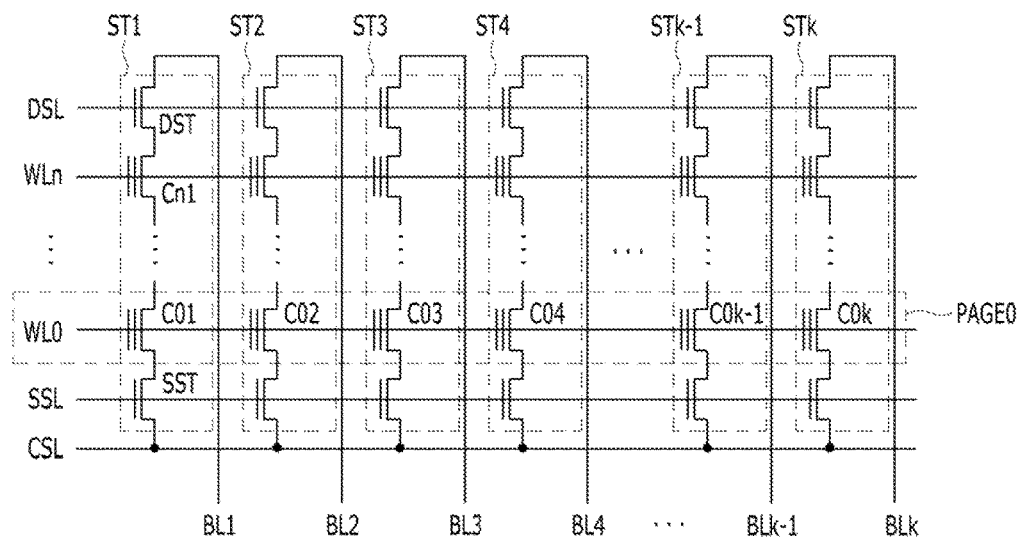
FIG. 2B is a circuit diagram illustrating an exemplary configuration of a memory cell array of FIG. 2A.

FIG. 2A is a block diagram illustrating a configuration of a memory device in accordance with various embodiments. FIG. 2B is a circuit diagram illustrating an exemplary configuration of a memory cell array of FIG. 2A. The memory device of FIG. 2A may correspond to the memory device 150 of FIG. 1.

Referring to FIG. 2A, the memory device 150 may include a memory cell array 210 and a peripheral circuit. The memory cell array 210 may include first to m-th memory blocks 211 to 21m. The peripheral circuit may be configured to perform a read operation on memory cells included in a selected page of the memory blacks 211 to 21m. The peripheral circuit may include a control logic 220, a voltage supply unit 230, a page buffer group 240, a column decoder 250 and an input/output unit 260.

Referring to FIG. 2B, the memory blocks 211 to 21m of the memory cell array 210 may include a plurality of strings ST1 to STk coupled between bit lines BL1 to BLk and a common source line CSL. The strings ST1 to STk may be coupled to the corresponding bit lines BL1 to BLk, and coupled to the common source line CSL in common. Each of the strings ST1 to STk may include a source select transistor SST having a source coupled to the common source line CSL, a plurality of memory cells C01 to Cn1, and a drain select transistor DST having a drain coupled to the corresponding bit line among the bit lines BL1 to BLk. The memory cells in each string (for example, C01 to Cn1 coupled to BL1) may be coupled in series between the select transistors SST and DST. The gate of each of the source select transistors SST may be coupled to a source select line SSL, the gates of the memory cells C01 to Cn1 may be coupled to respective word lines WL0 to WLn, and the gate of each of the drain select transistors DST may be coupled to a drain select line DSL.

The memory cells included in the memory blocks 211 to 21m may be divided on a physical or logical page basis. For example, memory cells coupled to one word line (for example, the memory cells C01 to C0k coupled to the word line WL0) may constitute one physical page PAGE0. Each page of the memory cell array 210 may be set to be the basic unit of a read or write operation.

Referring again to FIG. 2A, the memory blocks 211 to 21m may be divided into single level cell (SLC) memory blocks and multi-level cell (MLC) memory blocks, depending on the number of bits which can be stored in one memory cell or expressed by one memory cell. The SLC memory block may include a plurality of pages having memory cells each configured to store 1-bit data. The SLC memory block may provide excellent data operation performance and high durability. The MLC memory block may include a plurality of pages having memory cells each configured to store multi-bit data (for example, two bits of most significant bit (MSB) and least significant bit (LSB)). The MLC memory block may have a larger data storage space than the SLC memory block (i.e., high integration density). Furthermore, a triple level cell (TLC) memory block may include a plurality of pages having memory cells each configured to store 3-bit data (MSB, LSB and center significant bit (CSB)).

The control logic 220 may output a voltage control signal for generating a voltage required for performing a read operation in response to a command CMD inputted through the input/output unit 260 an external circuit or device, and output a control signal for controlling page buffers PB1 to PBk included in the page buffer group 240. The control logic 220 may output a row address signal and a column address signal in response to an address signal ADD inputted an external circuit or device through the input/output unit 260.

The control logic 220 may include a read retry (RR) table 222. The RR table 222 may include information for changing a read voltage when the memory device 150 of FIG. 1 performs a read retry operation. The control logic 220 may perform a control operation for generating a read voltage based on read voltages in a set shift direction (i.e., negative direction or positive direction) in the RR table 222 according to control of the controller 130.

The voltage supply unit 230 may generate operation voltages required for a read operation based on the voltage control signal of the control logic 220, and supply the generated operation voltages to local lines including the drain select line DSL, the word lines WL0 to WLn and the source select line SSL of a memory block selected in the memory cell array 210. The voltage supply unit 230 may include a voltage generator and a row decoder. Alternatively, the voltage supply unit 230 may include a voltage generator, and the memory cell array 210 may include a row decoder therein. The voltage generator may supply operation voltages required for a read operation of the memory cell array 210 to global lines in response to the voltage control signal of the control logic 220. The row decoder may couple the global lines to the local lines DSL, WL0 to and SSL in response to row address signals of the control logic 220, such that the operation voltages outputted to the global lines by the voltage generator can be transmitted to the local lines DSL, WL0 to WLn and SSL of the selected memory block in the memory cell array 210.

The page buffer group 240 may include the plurality of page buffers PB1 to PBk coupled to the memory cell array 210 through the bit lines BL1 to BLk, respectively. The page buffers PB1 to PBk of the page buffer group 240 may process page data in response to the control signal of the control logic 220. For example, during a write mode, the page buffer group 240 may selectively precharge the bit lines BL1 to BLk depending on input data, in order to store data in a page region (for example, C01 to C0k) of the memory cell array 210. Furthermore, during a read mode, the page buffer group 240 may sense the voltages of the bit lines BL1 to BLk, in order to read data from the memory cell array 210.

The column decoder 250 may select the page buffers PB1 to PBk included in the page buffer group 240 in response to a column address signal outputted from the control logic 220. That is, the column decoder 250 may sequentially transmit data, which are to be stored in memory cells, to the page buffers PB1 to PBk in response to the column address signal. Furthermore, the column decoder 250 may sequentially select the page buffers PB1 to PBk in response to the column address signal, such that the data of the memory cells, latched in the page buffers PB1 to PBk, can be outputted to an external circuit or device by a read operation.

The input/output unit 260 may transmit data an external circuit or device to the column decoder 250 according to control of the control logic 220, in order to store the data in memory cells during a program operation. The column decoder 250 may transmit the data from the input/output unit 260 to the page buffers PB1 to PBk of the page buffer group 24, and the page buffers PB1 to PBk may store the input data in internal latch units thereof. Furthermore, during a read operation, the input/output unit 260 may output data to an external circuit or device, the data being from the page buffers PB1 to PBk of the page buffer group 240 through the column decoder 250.

For illustration, FIGS. 2A and 2B illustrate a memory device and a memory block which are constituted by NAND flash memory cells. However, a memory block of a memory device in accordance with various embodiments is not limited to the NAND flash memory, but may be implemented with a NOR flash memory, a hybrid flash memory in which two or more types of memory cells are mixed, and a one-NAND flash memory having a controller embedded in a memory chip. The operation characteristics of the semiconductor device may be applied to not only a flash memory device having a charge storage layer implemented with a conductive floating gate, but also a charge trap flash (CTF) memory device having a charge storage layer implemented with an insulating film.

Figure 3:
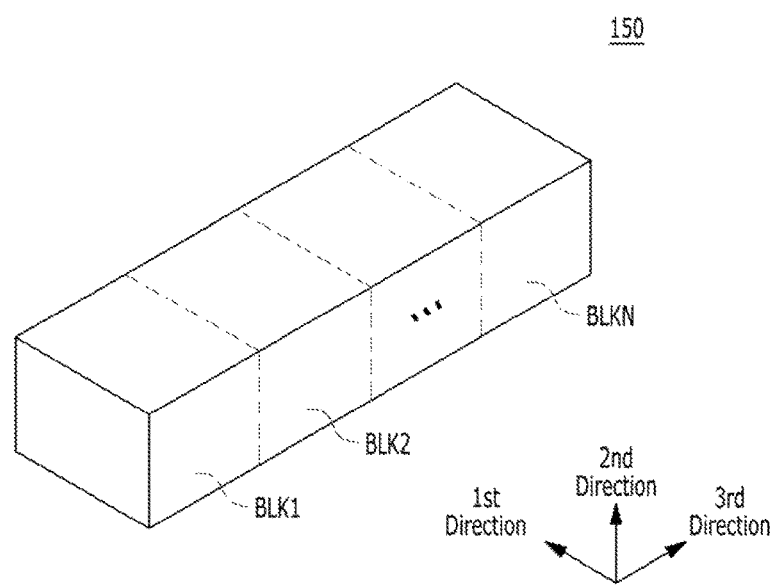
FIG. 3 is a diagram schematically illustrating the architecture of a three-dimensional (3D) memory device in accordance with various embodiments of the present invention.

FIG. 3 is a diagram schematically illustrating the architecture of a memory device in accordance with various embodiments.

Referring to FIG. 3, the memory device 150 may include a 2-dimensional (2D) memory device or 3-dimensional (3D) memory device. The memory device may include a plurality of memory blocks BLK1 to BLKN. For example, the respective memory blocks BLK1 to BLKN may have a 3D architecture including a structure which extends in first to third directions, for example, x-axis, y-axis and z-axis directions. Each of the memory blocks BLK1 to BLKN may include a plurality of NAND strings extending in the second direction. The plurality of NAND strings may be provided in the first and third directions. Each of the NAND strings may be electrically coupled to a bit line, at least one drain select line, at least one source select line, a plurality of word lines, at least one dummy word line and a common source line, and a plurality of transistor structures.

Among the plurality of memory blocks of the memory device 150, each of the memory blocks BLK include a plurality of NAND strings coupled to a plurality of respective bit lines BL, and a common source line as described above with respect to FIG. 2B. Each of the memory blocks may include, in addition to normal memory cells and word lines, a plurality of dummy memory cells coupled to respective dummy word lines DSL (not shown).

Referring again to FIG. 1, the controller 130 may perform a read retry operation when a read fail signal is generated by the ECC unit 138. For this operation, the controller 130 may read the RR retry table 222 (see FIG. 2A) stored in the memory device 150 at a specific time (for example, during a system reset), and store the RR table in the memory 144. Hence, when a read fail occurs, the controller 130 may perform a read retry operation based on the RR table.

The RR table may store read voltage information for performing a read retry operation on the memory device 150. The read voltage information may include information regarding read retry voltages a large number of steps (for example, ranging from 32 steps to 50 steps). The RR table may include data which are acquired as experimental values during fabrication. For example, when the memory device is a NAND Flash memory, the RR table may include read voltage information of a large number of steps (for example, from 32 steps to 50 steps) to cover a large number of cases for shift, and store indexes which are mapped to information capable of shifting a read voltage in the negative or positive direction. That is, the read voltage information may serve as information capable of shifting a read voltage in the negative direction or positive direction. When a read fail occurs, it is difficult to recognize the direction to shift the read voltage. Therefore, when read retry operations are performed, the memory device 150 may sequentially perform the read retry operations based on the indexes of the RR table. At this time, when a read retry operation which does not correspond to the condition of the read fail is performed, the overhead of the read retry operation may be unnecessarily increased. In order to reduce the overhead of the read retry operation, the memory device 150 may minimize the read retry steps to a range of 5 steps to 7 steps, for example, by setting high priority read retry (HPRR) steps in the RR table. However, when the read retry operation is fixed to some of the full read retry steps ranging from 32 steps to 50 steps, the scope of the read retry operation may be reduced.

In the read retry method in accordance with various embodiments of the present invention, when a read fail occurs, the controller 130 may set a default voltage of the RR table in the memory device 150, and set the shift direction of the read voltage based on memory cells outputted from the memory device 150. When the shift direction is set, the controller 130 may control the memory device 150 to perform a read retry operation based on read voltages in the shift direction in the RR table. That is, the controller 130 may control the memory device 150 not to use read voltage information which does not correspond to the shift direction in the RR table.

Figure 4A:
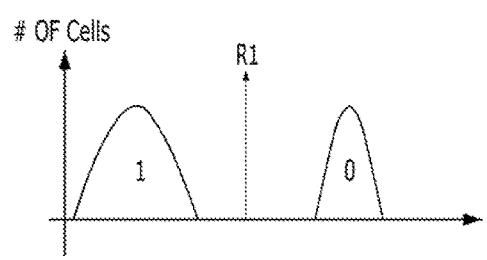
FIGS. 4A to 4C are diagrams illustrating cell codes for memory devices in accordance with various embodiments of the present invention.
Figure 4B:
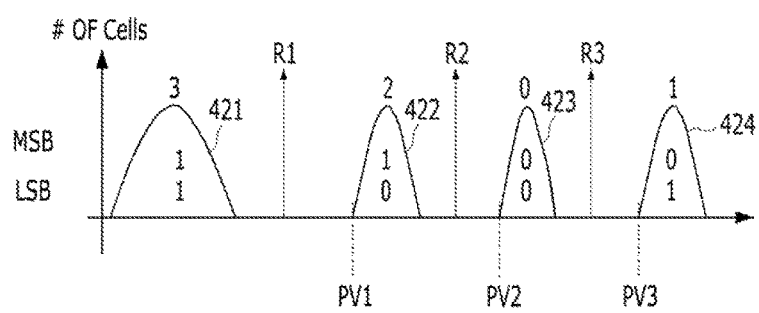
Figure 4C:
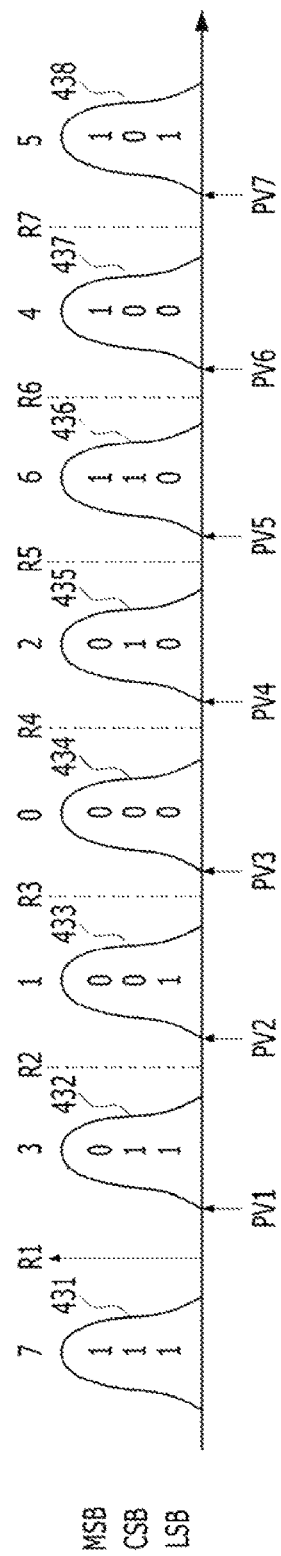
Figure 5A:
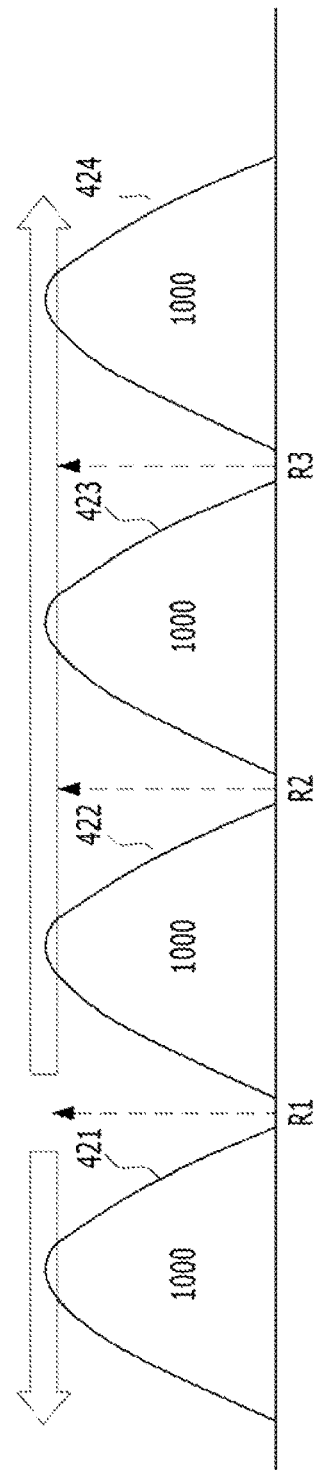
Figure 5B:
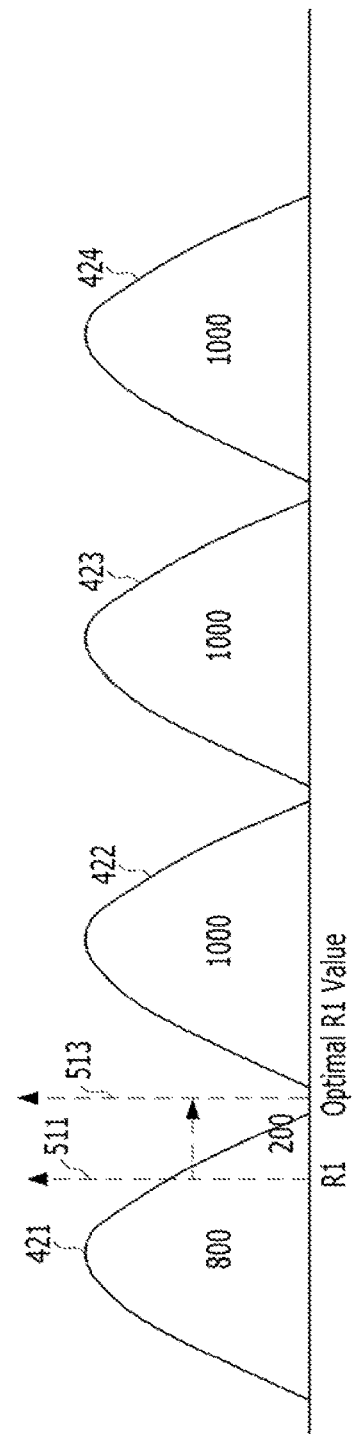

FIGS. 4A to 4C are diagrams illustrating cell codes for memory devices in accordance with various embodiments. FIGS. 5A to 5C are diagrams illustrating a method for setting the index sequence of a read retry (RR) table using cell counts in accordance with various embodiments. FIG. 6 is a diagram illustrating an example of a read retry (RR) table for MLC-type memory cells.

Referring to FIGS. 4A to 4C, R1 to R7 may represent read voltages, and PV may represent a program and verify voltage. FIG. 4A illustrates an SLC-type read voltage, FIG.

4B illustrates MLC-type program and verify voltages PV1 to PV3 and read voltages R1 to R3, and FIG. 4C illustrates TLC-type read voltages.

Each of the memory cells may have a different number of bits programmed per cell window, depending on the type of the memory cell. The SLC-type memory cell may program one bit per cell window, the MLC-type memory cell may program two bits per cell window, and the TLC-type memory cell may program three bits per cell window. Although not illustrated, four or more bits may be programmed per cell window.

Referring to FIG. 4B, the MLC-type memory cells may program two bits per cell window, and each of the cells may be programmed to an arbitrary state among four states of 00, 01, 10 and 11. During an erase operation, all MLC-type memory cells in a memory block may be erased by a threshold voltage lower than an erase and verify voltage. Then, the cells within the memory cell array may be programmed to one of states 421 to 424 by threshold voltages set to above the program and verify voltages PV1, PV2 and PV3, respectively. Furthermore, when the programmed MLC-type memory cells are read, program data may be read according to the read voltages R1 to R3, When data of an MLC-type memory cell are read, the LSB of the data may be read by the read voltages R1 and R3, and the MSB of the data may be read by the read voltage R2.

Referring to FIG. 4C, the TCL-type memory cells may program three bits per cell window, and each of the cells may be programmed to an arbitrary state among eight states of 000, 001, 010, 011, 100, 101, 110 and 111. The TLC memory cells may be programmed to one of states 431 to 438 by threshold voltages set to above the program and verify voltages PV1 to PV7, respectively. Furthermore, when the programmed TLC-type memory cells are read, program data may be read according to the read voltages R1 to R7. When data of a TLC-type memory cell are read, the LSB of the data may be read by the read voltages R3 and R7, the CSB of the data may be read by the read voltages R2, R4 and R6, and the MSB of the data may be read by the read voltages R1 and R5.

FIGS. 4B and 4C illustrate an example of a 3D flash memory device. In the case of the 3D flash memory, the cell codes 421 to 424 in FIG. 4B may be set to 3, 2, 0 and 1, and the cell codes 431 to 438 in FIG. 4C may be set to 7, 3, 1, 0, 2, 6, 4 and 5.

The following descriptions will be focused on the read retry operation based on the MLC-type memory cell.

When memory cells are ideally randomized, cell counts for the respective program and verify voltages may be equal to each other as illustrated in FIG. 5A. FIG. 5A exemplifies that the number of cells for each program and verify voltage is set to 1,000. When a memory cell is read by a specific read voltage in the case where the numbers of cells for the respective program and verify voltages are equal to each other, the distribution direction may be set based on the number of read cells. For example, when data of the memory device 150 are read by a read voltage R1, data in the left side based on the read voltage R1 may have a value of 1, and data in the right side based on the read voltage R1 may have a value of 0. In this case, the number of 1 bits may correspond to 1,000, and the number of 0 bits may correspond to 3000.

At this time, when the read voltage R1 is located in the distribution 421 as indicated by reference numeral 511 in FIG. 5B, the number of 1 bits in the left side based on R1 may decrease, and the number of 0 bits in the right side may increase. For example, under the supposition that the number of bits read by the read voltage R1 as indicated by reference numeral 511 is 800, the optimal value of the read voltage R1 needs to be shifted in the positive direction as indicated by reference numeral 513, in order to prevent a read fail. That is, when the default read voltage R1 indicated by reference numeral 511 is shifted in the positive direction as indicated by reference numeral 513, a read fail can be prevented.

Furthermore, when the read voltage R1 is located in the distribution 422 as indicated by reference numeral 521 in FIG. 5C, the number of 1 bits in the left side based on R1 may increase, and the number of 0 bits in the right side may decrease. For example, under the supposition that the number of bits read by the read voltage R1 as indicated by reference numeral 521 is 1,200, the optimal value of the read voltage R1 needs to be shifted in the negative direction as indicated by reference numeral 523, in order to prevent a read fail. That is, when the default read voltage R1 indicated by reference numeral 521 is shifted in the negative direction as indicated by reference numeral 523, a read fail can be prevented.

When a read fail is recognized, the read retry method in accordance with the various embodiments may supply a default read voltage to the memory device, set the shift direction of the read voltage by counting the number of cells in the left and/or right side based on the default read voltage, select read voltages in the set shift direction from the RR table, and control the read retry operation of the memory device 150.

FIG. 6 illustrates an example of a read retry (RR) Table for MLC-type memory cells. FIG. 6 shows that the RR table stores 32 steps of read voltage information for each of the read voltages R1 to R3 of the MLC-type memory cells. In the RR table, "0x0X" may represent read voltage information capable of shifting a read voltage in the positive direction (i.e., right direction), and "0xFX" and "0xEX" may represent read voltage information capable of shifting a read voltage in the negative direction (i.e., left direction).

The RR table may include the 32 steps RR0 to RR31 of read voltage information. During a read retry operation, the memory device 150 may sequentially perform the steps RR0 to RR31 in the RR table, in order to completely perform the read retry operation. In the various embodiments, when a read fail is recognized, the controller 130 may count the number of cells read by the memory device 150 using a default read voltage (for example, RR0 of FIG. 6) in the RR table, and determine the shift direction of the default read voltage based on the counted number. After determining the shift direction, the controller 130 may control the read retry operation by applying read voltage information corresponding to the steps (or indexes) having a value corresponding to the shift direction of the RR table to the memory device 150. For example, when the shift direction is set to the positive direction by the default read voltage R1 as illustrated in FIG. 5B, the controller 130 may perform the read retry operation using the steps RR3, RR4, RR8, RR14, RR15 and RR23 in the RR table of FIG. 6, thereby having the same effect as if all the RR steps in the positive direction (i.e., right side) set to the direction of the read voltage R1 were performed. Thus, while performing the read retry operation based on some of the read voltage information in the RR table, the memory device 500 can have the same scope or coverage as if all the RR steps were performed. Therefore, since the memory device 500 does not perform an unnecessary read retry operation, the read retry performance can be improved.

Figure 7:
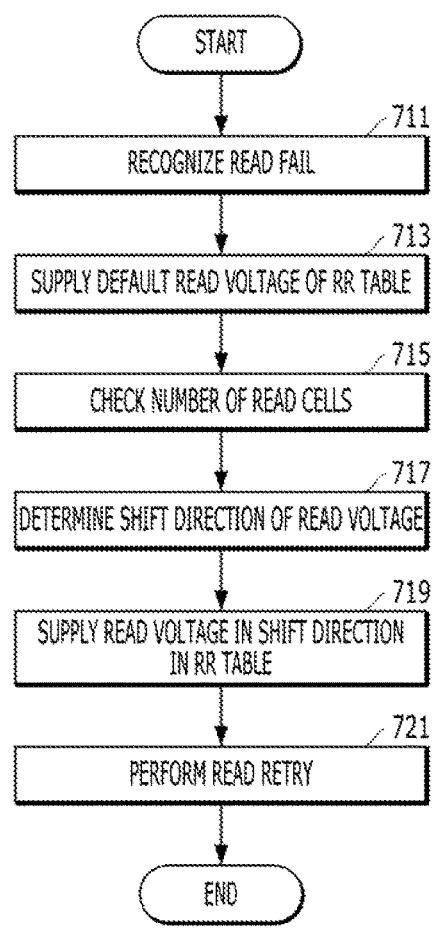
FIG. 7 is a flowchart illustrating a method for performing a read retry operation in a memory system in accordance with various embodiments of the present invention.

FIG. 7 is a flowchart illustrating a method for performing a read retry operation in a memory system in accordance with various embodiments. For example, the read retry operation may be performed by the memory system including the controller 130 and the memory device 150 in FIGS. 1 and 2.

Referring to FIG. 7, the controller 130 may read information of the RR table 222 of the memory device 150, and store the read information in the memory 144. The controller 130 may control the memory device 150 to perform a read operation. When a read fail occurs in the memory device 150 during the read operation, the controller 130 may recognize the read fail at step 711. Then, the controller 130 may read default read voltage information of the RR table and output the read information to the memory device 150 at step 713. The memory device 150 may generate a default voltage corresponding to the default read voltage information, supply the generated default voltage to the memory cell array 210, and output data read from the memory cell array 210 to the controller 130.

The controller 130 may count the number of cells read from the memory device 150 in the left and/or right direction of the default read voltage at step 715, and determine the shift direction of the default read voltage at step 717. The shift direction may be set to the right direction (i.e., positive direction) or the left direction (i.e., negative direction) of the read voltage. When the shift direction of the read voltage is determined, the controller 130 may select read voltage information related to the shift direction from the read voltage information stored in the RR table at step 719. Then, the controller 130 may control the memory device 150 to perform a read retry operation based on the read voltage information in the determined shift direction at step 721. In other words, the controller 130 may sequentially output read bias information, related to the shift direction of the default read voltage in the RR table, to the memory device 150 at step 719, and the memory device 150 may perform the read retry operation based on the read bias information which is sequentially inputted, at step 721.

During the read retry operation, the ECC unit 138 of the controller 130 may perform an error correction function on data read by the memory device 150. At this time, when no read fails occur, the controller 130 may set the corresponding read voltage to the read voltage of the memory device 150. That is, the controller 130 may shift the read voltage in the determined shift direction by sequentially applying the read voltage information in the corresponding direction in the RR table to the memory device 150. When the ECC unit 138 can correct an error of the read data while the read voltage is shifted, the controller 130 may stop transmitting the read voltage information to the memory device 150, and end the read retry operation.

Figure 8:
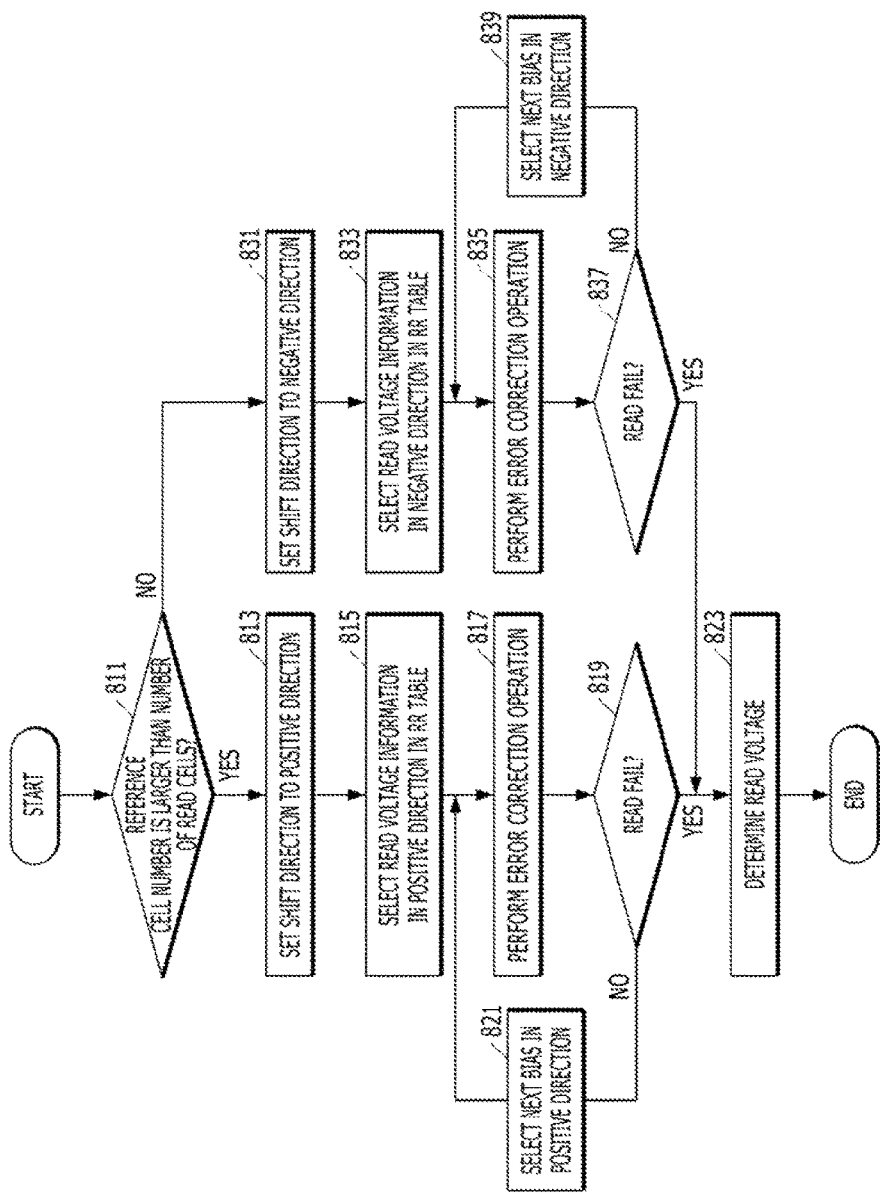
FIG. 8 is a flowchart illustrating a read retry operation in accordance with various embodiments of the present invention.

FIG. 8 is a flowchart illustrating a read retry operation in accordance with various embodiments. For example, the read retry operation may be performed by the memory system including the controller 130 and the memory device 150 in FIGS. 1 and 2.

Referring to FIG. 8, the controller 130 may count the number of cells read in the memory device 150 based on the default read voltage, and analyze the counted number of cells and a reference number of cells (also referred to as 'reference cell number'). For example, as shown in FIG. 5A, the reference cell number may be set to 1,000. At this time, when the counted number of cells is smaller than the reference cell number, the controller 130 may recognize the difference at step 811, and set the shift direction of the read voltage to the positive direction at step 813. For example, when the reference cell number (for example, 1,000) is larger than the number of cells read by the default read voltage 511 (for example, 800) as illustrated in FIG. 5B, the read voltage needs to be shifted in the right direction (i.e., positive direction) as indicated by reference numeral 513, in order to prevent a read fail. After the shift direction of the read voltage is set in the positive direction, the controller 130 may select read bias information capable of shifting the read voltage in the positive direction in the RR table of FIG. 6, and transmit the selected bias voltage information to the memory device 150.

The memory device 150 may generate a read voltage corresponding to the input read bias information, read data stored in a memory cell using the generated read voltage, and output the read data. After outputting the read voltage information, the controller 130 may correct an error of the read data at step 817. In other words, the controller 130 may perform error correction operation for the read data using error correction code (ECC). Then, the controller 130 may verify whether a read fail is present, according to the error correction result, at step 819. At this time, when a read fail is present, the controller 130 may recognize the read fail at step 819, select the next read voltage information in the set shift direction from the RR table at step 821, and transmit the selected read voltage information to the memory device 150. That is, when the read fail is retained, the controller 130 may not sequentially transmit all of read voltage information of the RR table, but may sequentially select and transmit read voltage information capable of shifting a read voltage in the determined shift direction. After selecting the next read voltage information at step 821, the controller 130 may verify whether a read fail is present in data read by the read retry operation, while performing steps 817 and 819.

When no read fails occur while steps 817 and 821 are performed or when error correction operation is normally performed, the controller 130 may recognize this situation at step 819, set the read voltage, at which the error correction operation was normally performed, to the read voltage of the memory device 150, and end the read retry operation.

When the counted number of cells is larger than the reference cell number, the controller 130 may recognize the difference at step 811, and set the shift direction of the read voltage to the negative direction at step 831. For example, when the reference cell number (for example, 1,000) is smaller than the number of cells read by the default read voltage 521 (for example, 1,200) as illustrated in FIG. 5C, the read voltage needs to be shifted in the left direction (i.e., negative direction) as indicated by reference numeral 523, in order to prevent a read fail. After the shift direction of the read voltage is set to the negative direction, the controller 130 may select the read bias information capable of shifting the read voltage in the negative direction in the RR table of FIG. 6, and transmit the selected bias voltage information to the memory device 150, at step 833.

The memory device 150 may generate a read voltage corresponding to the input read bias information, read data stored in a memory cell using the generated read voltage, and output the read data. After outputting the read voltage information, the controller 130 may correct an error of the read data at step 835. In other words the controller 130 may perform error correction operation for the read data using error correction code (ECC). Then, the controller 130 may verify whether a read fail is present, according to the error correction result, at step 837. At this time, when a read fail is present, the controller 130 may recognize the read fail at step 837, and select the next read voltage information in the set shift direction from the RR table and transmit the selected read voltage information to the memory device 150 at step 839. Then, while repeating steps 835 and 837, the controller 130 may verify whether a read fail occurs in the data read by the read retry operation. When no read fails occur while steps 835 and 837 are performed or when error correction operation is normally performed, the controller 130 may recognize this situation at step 837, set the read voltage, at which the error correction operation was normally performed, to the read voltage of the memory device 150, and end the read retry operation.

As illustrated in FIG. 8, the controller 130 may determine the shift direction of the read voltage during the read retry operation, select read bias information capable of shifting the read voltage in the determined shift direction from the RR table while performing steps 815 to 819 or steps 833 to 839, and control the read retry operation of the memory device 150. At this time, the operation of selecting the read bias information in the RR table and outputting the selected information to the memory device 150 may be performed while a read fail is retained. When the read fail is removed, the controller 130 may stop the operation of selecting read bias information in the RR table and outputting the read bias information to the memory device 150 at the corresponding time point, and end the read retry operation.

Figure 9:
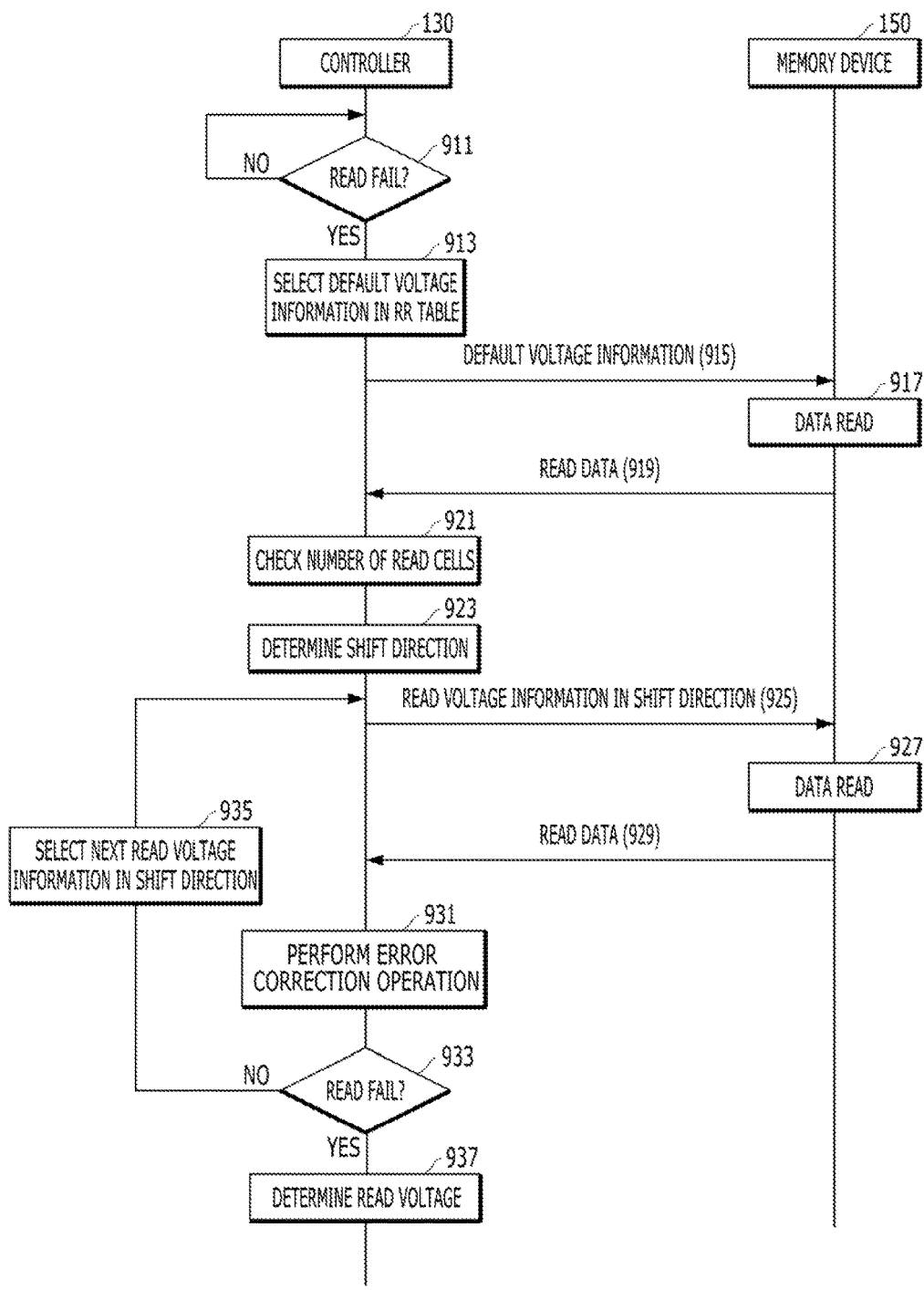
FIG. 9 is a diagram illustrating a procedure of performing a read retry operation between a controller and a memory device in a memory system in accordance with various embodiments of the present invention.

FIG. 9 is a diagram illustrating a procedure for performing a read retry operation between a controller and a memory device in a memory system in accordance with the various embodiments. For example, the read retry operation may be performed by the memory system including the controller 130 and the memory device 150 in FIGS. 1 and 2.

Referring to FIG. 9, when a read fail occurs in the memory device 150, the controller 130 may recognize the read fail at step 911, select default read voltage information in the RR table at step 913, and transmit the selected default read voltage information to the memory device 150 at step 915. The memory device 150 receiving the default voltage information may generate a read voltage based on the default voltage information and read data using the generated read voltage, at step 917. The memory device 150 may transmit the read data to the controller 130 at step 919.

When the data read by the default read voltage is received, the controller 130 may count the number of cells positioned in the left side (and/or the number of cells positioned in the right side) based on the default read voltage, at step 921. Then, as shown in FIG. 8, the controller 130 may compare the counted number of cells and the reference cell number and determine the shift direction of the read voltage to remove the read fail based on the comparison result, at step 923. After determining the shift direction, the controller 130 may select first read voltage information capable of shifting the read voltage in the determined shift direction in the RR table, and then transmit the selected read voltage information to the memory device 150 at step 925.

When the read voltage information is received, the memory device 150 may read data using a read voltage based on the received read voltage information at step 927, and transmit the read data to the controller 130 at step 929. When the read data based on the selected read voltage information are received, the controller 130 may perform an error correction operation on the received data at step 931. When the error correction is not normally performed (i.e., a read fail is retained), the controller 130 may recognize the read fail at step 933. Then, the controller 130 may select the next read voltage information capable of shifting the read voltage the determined shift direction in the RR table at step 935, and transmit the selected read voltage information to the memory device 150 at step 925.

The operation from step 925 to step 935 may be repeated as the read retry operation, until no read fails occur. That is, the controller 130 may sequentially select read voltage information capable of shifting the read voltage in the determined shift direction in the RR table, and transmit the selected read voltage information to the memory device 150. The memory device 150 may read data using the read voltage based on the read voltage information which is sequentially inputted. When the error correction operation is normally performed while the read retry operation is performed or when no read fails occur, the controller 130 may recognize this situation at step 933, and set the read voltage, at which no read fails occur, to the read voltage of the memory device 150 at, step 937.

As described above, when the read retry operation is performed, the read voltage information selected from the RR table may include read voltage information in the determined shift direction (i.e., left or right direction), and the memory device 150 may perform the read retry operation while changing the read voltage in one direction. That is, the read retry operation in accordance with the various embodiments may have a characteristic in which the read voltage is not shifted to the left and right directions based on the default read voltage, but shifted in one direction based on the default read voltage. Furthermore, the read voltage information contained in the RR table may include information for shifting the read voltage to the right or left direction. For example, the RR table may store read voltage information capable of shifting the read voltage in the positive direction based on the default read voltage and read voltage information capable of shifting the read voltage in the negative direction, at the same or similar ratio. Thus, during the read retry operation, the controller 130 may determine the shift direction of the read voltage, and select only read voltage information capable of shifting the read voltage in the corresponding shift direction, thereby reducing the number of read retry operations and the read voltage determination time.

The memory cells of the memory device 150 may include SLC, MLC or TLC-type memory cells to program data. Each of the SLC-type memory cells may program 1-bit data therein, and each of the MLC or TCL-type memory cells may program multi-bit data therein. In the case of the SLC-type memory cell, the controller 130 may determine the shift direction of the read voltage using the read voltage R1 as shown in FIG. 4A. In the case of MLC or TLC-type memory cell, the controller 130 may check the type of a page in which a read fail occurred (for example, LSB, CSB or MSB), and then determine the shift direction of the read voltage by combining the read voltages R1 to R3 or R1 to R7 according to the corresponding page type as shown in FIGS. 4B and 4C.

Hereafter, the read retry operation of the memory device 150 including the MLC-type memory cells will be described.

As described above, when the memory cells of the memory device 150 such as flash memory are ideally randomized, the numbers of cells for the respective program and verify voltages PV1 to PV3 may be equal to each other. When performing a read retry operation, the controller 130 may calculate the number of cells for each of the program and verify voltages PV, based on a default read level (or a combination of the default read voltages R1 to R3). According to the LSB determination standard, the controller 130 may calculate an erased cell count by reading the cells using the read voltage R1. When the erased cell count is smaller than the number of cells for each of the program and verify voltages PV, the controller 130 needs to shift the optimal read voltage to the right side based on the read voltage R1 in order to remove a read fail. When performing read retry steps having R1 values which are toward the right side of the default read voltage R1 in the RR table based on the determined shift direction (for example, right direction), the controller 130 may perform all the steps with R1 and R3 toward the determined shift direction, among the 32 steps of the RR table illustrated in FIG. 6. At this time, the number of the corresponding steps may be less than eight. Therefore, the read retry method in accordance with the various embodiments may have no significant difference in the retry count from the HPRR method, and may have the same effect as if all the 32 steps of the RR table were performed. For all pages, the con roller 130 may determine the direction using R1&R2&R3 ((LSB=R1 & R3), (MSB=R2)).

Figure 10:
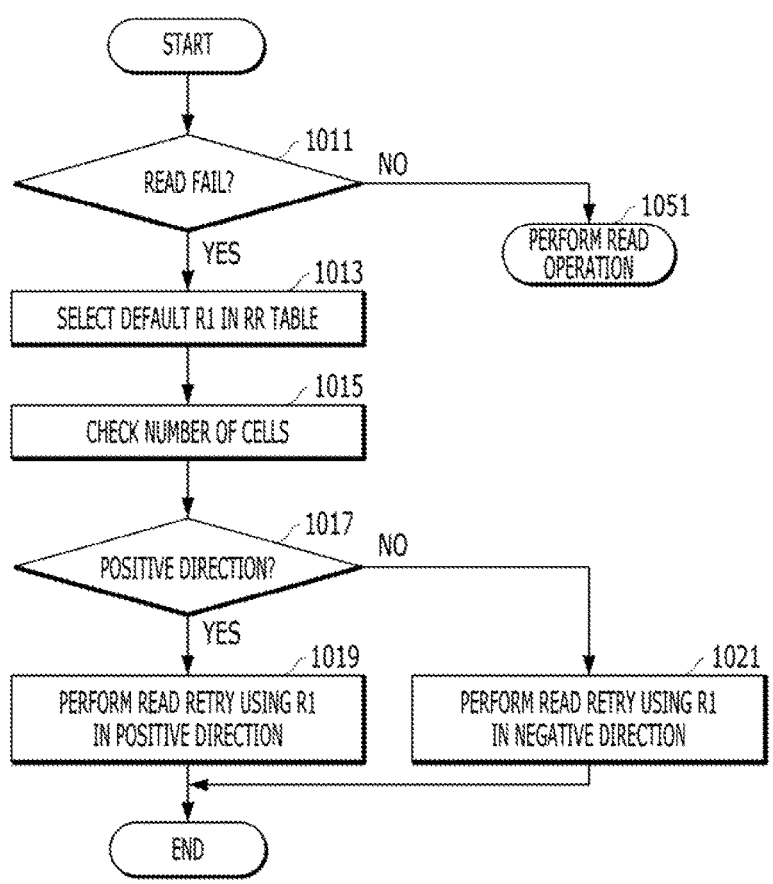
FIG. 10 is a flowchart illustrating a method for performing a read retry operation in a memory device including single-level cell (SLC)-type memory cells in accordance with various embodiments of the present invention.

FIG. 10 is a flowchart illustrating a method for performing a read retry operation in a memory device including single level cell (SLC)-type memory cells in accordance with various embodiments. For example, the read retry operation may be performed by the memory system including the controller 130 and the memory device 150 in FIGS. 1 and 2.

Referring to FIG. 10, the controller 130 may verify whether a read fail occurred at step 1011. When no read fails are recognized, the controller 130 may perform a read operation at step 1051. On the other hand, when a read fail has occurred, the controller 130 may recognize the read fail at step 1011, select default read voltage information R1 from the RR table at step 1013, and transmit the selected default read voltage information R1 to the memory device 150. The RR table may include a table for storing the default read voltage information R1 corresponding to SLC. Then, the controller 130 may count the number of cells read in the memory device 150 at step 1015. At this time, the read data may include page data. The controller 130 may determine the shift direction of the default read voltage R1 (i.e., positive direction or negative direction) by comparing the reference cell number to the counted number of cells at step 1017. At this time, when the default read voltage R1 needs to be shifted in the positive direction, the controller 130 may sequentially select read voltage information capable of shifting the read voltage in the positive direction in the RR table, and perform a read retry operation of the memory device 150, using R1 in the positive direction at step 1019. On the other hand, when the default read voltage R needs to be shifted in the negative direction, the controller 130 may sequentially select read voltage information capable of shifting the read voltage in the negative direction in the RR table, and perform a read retry operation of the memory device 150, using R1 in negative direction at step 1021.

Figure 11:
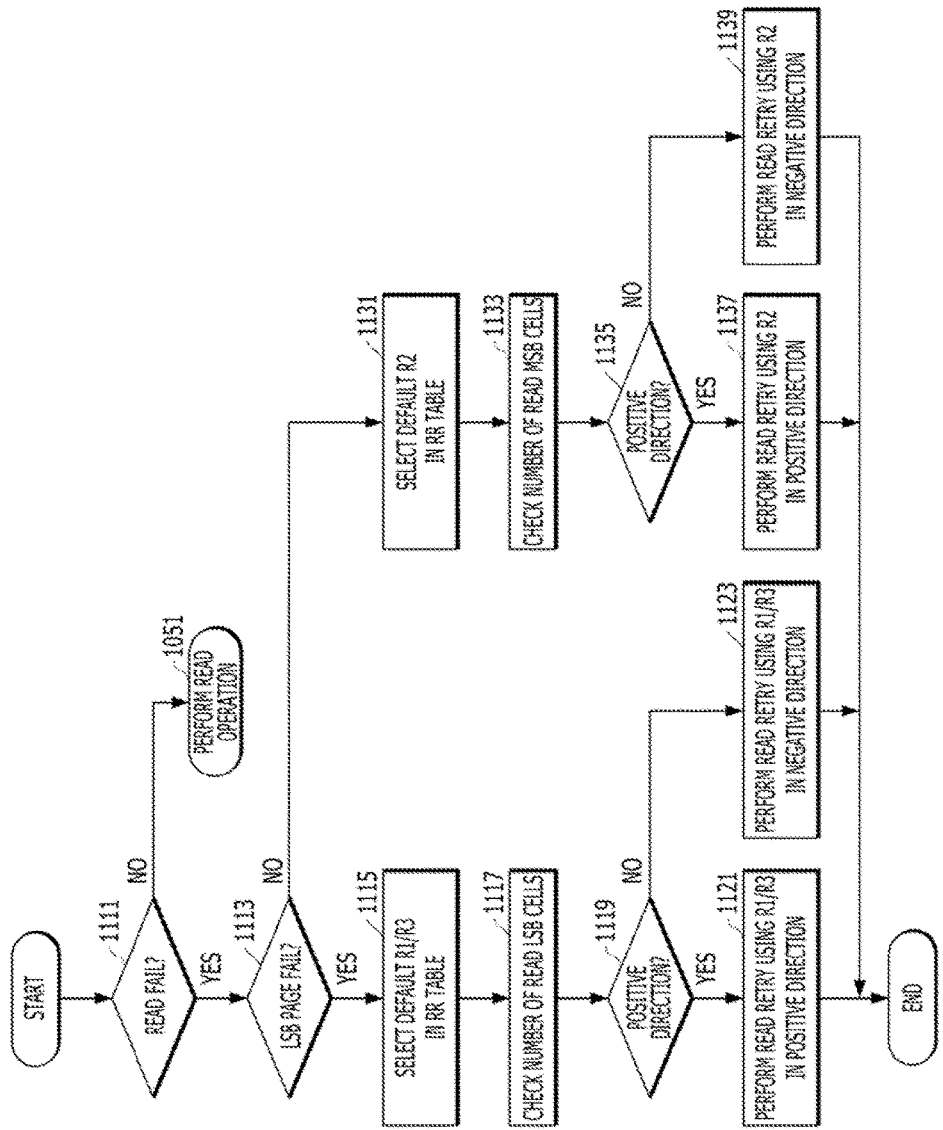
FIG. 11 is a flowchart illustrating a method for performing a read retry operation in a memory device including multi-level cell (MLC)-type memory cells in accordance with various embodiments of the present invention.

FIG. 11 is a flowchart illustrating a method for performing a read retry operation in a memory device including multi-level cell (MLC)-type memory cells in accordance with various embodiments of the present invention. For example, the read retry operation may be performed by the memory system including the controller 130 and the memory device 150 in FIGS. 1 and 2.

Each of the MLC-type memory cells may program 2-bit data of the LSB and MSB therein as shown in FIG. 4B. The RR table may include read voltages R1 to R3. When a read retry operation of the MLC-type memory cell is performed, the read voltage R1 and/or R3 may be allocated to the LSB, and the read voltage R2 may be allocated to the MSB.

Referring to FIG. 11, the controller 130 may verify whether a read fail occurred at step 1111. When no read fails are recognized, the controller 130 may perform a read operation at step 1051. On the other hand, when a read fail has occurred, the controller 130 may recognize the read fail at step 1111, and verify the type of a page in which the read fail occurred, at step 1113. In the MLC-type memory cell, a read fail may occur in the LSB page or MSB page. When a read fail occurs in the LSB page, the controller 130 may recognize the read fail at step 1113, select default read voltage information R1 and/or R3 in the RR table at step 1115, and transmit the selected default read voltage information R1 and/or R3 to the memory device 150. The RR table may include a table for storing the read voltage information R1 to R3 corresponding to MLC. Then, the controller 130 may count the number of cells read in the memory device 150 at step 1117. At this time, the read data may include the number of cells in the LSB page. For example, in FIG. 5A, the controller 130 may count the number of LSB cells in the distribution 421 based on the default read voltage information R1, and count the number of LSB cells in the distribution 424 based on the default read voltage information R3.

The controller 130 may determine the shift direction of the default read voltage (i.e., a positive direction or a negative direction) by comparing the reference cell number to the counted number of LSB cells, at step 1119. At this time, when the default read voltage needs to be shifted in the positive direction, the controller 130 may sequentially select read voltage information R1 and R3 capable of shifting the default read voltage in the positive direction in the RR table, and perform a read retry operation of the memory device 150, using the R1/R3 in the positive direction at step 1121. On the other hand, when the default read voltage needs to be shifted in the negative direction, the controller 130 may sequentially select read voltage information R1 and R3 capable of shifting the default read voltage in the negative direction in the RR table, and perform a read retry operation of the memory device 150, using the R1/R3 in the negative direction at step 1123.

When a read fail occurs in the MSB page, the controller 130 may recognize the read fail at step 1113, and select default read voltage information R2 in the RR table and transmit the selected default read voltage information R2 to the memory device 150, at step 1131. Then, the controller 130 may count the number of cells read in the memory device 150 at step 1133. At this time, the read data may include the number of cells in the MSB page. For example, in FIG. 5A, the controller 130 may count the numbers of MSB cells in the distributions 421 and 422, based on the default read voltage information R2. When 1,000 cells are programmed for each of the program and verify voltages PV as illustrated in FIG. 5A, the reference cell number may be set to 2,000, and the number of MSB cells read at a normal condition may also correspond to 2,000. The controller 130 may determine the shift direction of the default read voltage (positive direction or negative direction) by comparing the reference cell number to the number of read MSB cells at step 1133. After determining the shift direction of the default read voltage, the controller 130 may perform the read retry operation while performing steps 1135 to 1139. The operation from step 1135 to step 1139 may be performed in the same manner as the operation from step 1119 to step 1123.

Each of the TLC-type memory cells may program 3-bit data therein, the 3-bit data containing the LSB, CSB and MSB as shown in FIG. 4C. The RR table may include read voltages R1 to R7. When a read retry operation of the TLC-type memory cell is performed, the read voltages R3 and R7 may be allocated to the LSB, the read voltages R2, R4 and R6 may be allocated to the CSB, and the read voltages R1 and R5 may be allocated to the MSB.

The controller 130 may verify whether a read fail of the TLC-type memory cell occurred. When a read fail occurred, the controller 130 may verify the type of a page in which the read fail occurred. In the TLC-type memory cell, a read fail may occur in the LSB page, CSB page or MSB page. When the read fail occurred in the LSB page, the controller 130 may select the default read voltage R3 and/or R7 in the RR table, and read data of the LSB page in which the read fail occurred. When the read fail occurred in the CSB page, the controller 130 may select the default read voltage R2, R4 and/or R6 in the RR table, and read data of the CSB page in which the read fail occurred. When the read fail occurred in the MSB page, the controller 130 may select the default read voltage R1 and/or R5 in the RR table, and read data of the MSB page in which the read fail occurred.

The controller 130 may count the number of cells (i.e., LSB, CSB or MSB cells) read in the memory device 150. The controller 130 may determine the shift direction of the default read voltage (i.e., positive direction or negative direction) by comparing the reference cell number to the counted number of cells (i.e. LSB, CSB or MSB cells). At this time, when the default read voltage needs to be shifted in the positive direction (or negative direction), the controller 130 may sequentially select read voltage information of the corresponding page (for example, R3 and R7 in LSB, R2, R4 and R6 in CSB or R1 and R5 in MSB) from the RR table, the read voltage information being capable of shifting the default read voltage in the positive direction (or negative direction), and perform the read retry operation of the memory device 150.

When a read fail of the memory device is recognized, the apparatus and method for controlling a memory control in accordance with the various embodiments can perform a read retry operation while selecting the indexes of the RR table in a variable order, not fixed order, thereby reducing the number of read retry operations. Furthermore, in order to reduce the number of read retry operations, the apparatus and method can perform the read retry operations using indexes set in the direction capable of removing the read fail, among the whole indexes of the RR table, thereby having the same effect as if the apparatus and method performed the read retry operations using the whole indexes of the RR table.

Hereinbelow, detailed descriptions will be made with reference to FIGS. 12 to 17, for a data processing system and electronic appliances employing the memory system 110 including the memory device 150 and the controller 130 described above with reference to FIGS. 1 to 11, according to various embodiments of the present invention.

Figure 12:
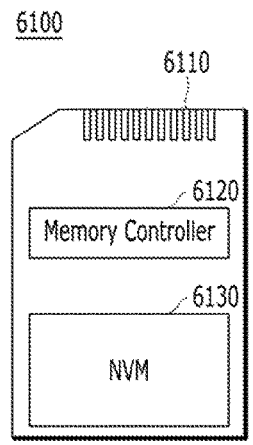
FIGS. 12 to 17 are block diagrams illustrating examples of the data processing system including a memory system in accordance with various embodiments of the present invention.

FIG. 12 is a diagram illustrating a data processing system including the memory system according to an embodiment of the present invention. Specifically, FIG. 12 illustrates a memory card system 6100 employing the memory system according to an embodiment of the present invention.

Referring to FIG. 12, the memory card system 6100 may include a memory controller 6120, a memory device 6130, and a connector 6110.

The memory controller 6120 may be operatively connected with the memory device 6130. The memory controller 6120 may access the memory device 6130 for controlling the operations of the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown) via the connector 6110. The memory controller 6120 may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1) through the connector 6110. For example, as described above with reference to FIG. 1, the memory controller 6120 may be configured to communicate with the external device through at least one of various communication protocols such as a universal serial bus (USB), a multimedia card (MMC), an embedded MMC (eMMC), a peripheral component interconnection (PCI), a PCI express (PCIe), an Advanced Technology Attachment (ATA), a Serial-ATA, a Parallel-ATA, a small computer system interface (SCSI), an enhanced small disk interface (ESDI), an Integrated Drive Electronics (IDE), a Firewire, a universal flash storage (UFS), a wireless-fidelity (WI-FI) and a Bluetooth. The memory system and the data processing system may be applied to wired and/or wireless electronic appliances, for example, a mobile electronic appliance.

The memory device 6130 may be implemented with a nonvolatile memory (NVM). For example, the memory device 6130 may be implemented with various nonvolatile memory devices such as, for example, an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (e.g., Personal Computer Memory Card International Association (PCM-CIA)), a compact flash card (CF), a smart media card (e.g. SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 13:
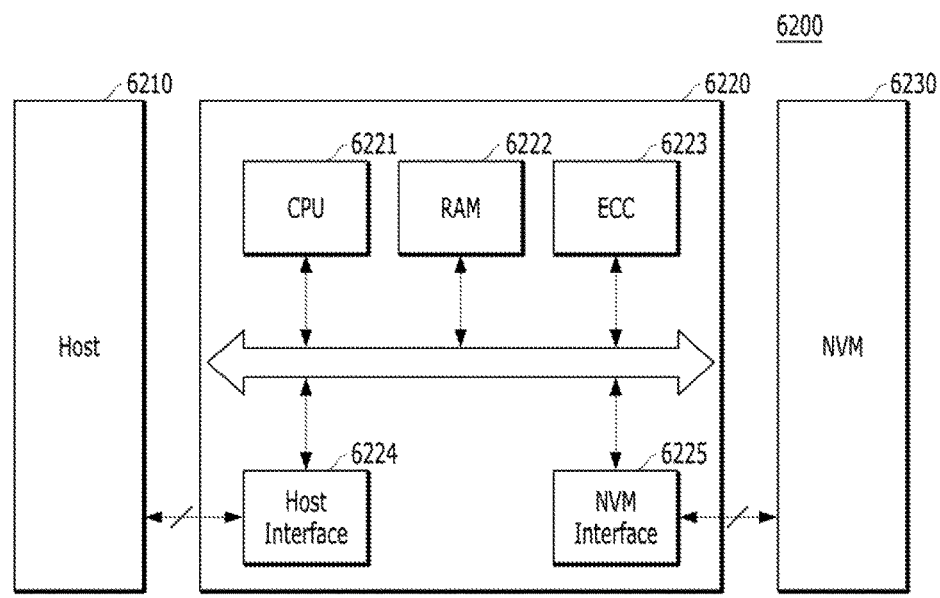

FIG. 13 is a diagram illustrating an example of a data processing system 6200 including a memory system according to an embodiment of the present invention.

Referring to FIG. 13, the data processing system 6200 may include a memory device 6230 which may be implemented with at least one nonvolatile memory (NVM) and a memory controller 6220 for controlling the memory device 6230. The data processing system 6200 may be a storage medium such as a memory card (e.g., a CF, a SD and a microSD), as described above with reference to FIG. 1. The memory device 6230 may correspond to the memory device 150 in the memory system 110 described above with reference to FIG. 1. The memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 may be used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. 1. As described above with reference to FIG. 1, the FCC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using one of various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired and/or wireless electronic appliances, for example, a mobile electronic appliance.

Figure 14:
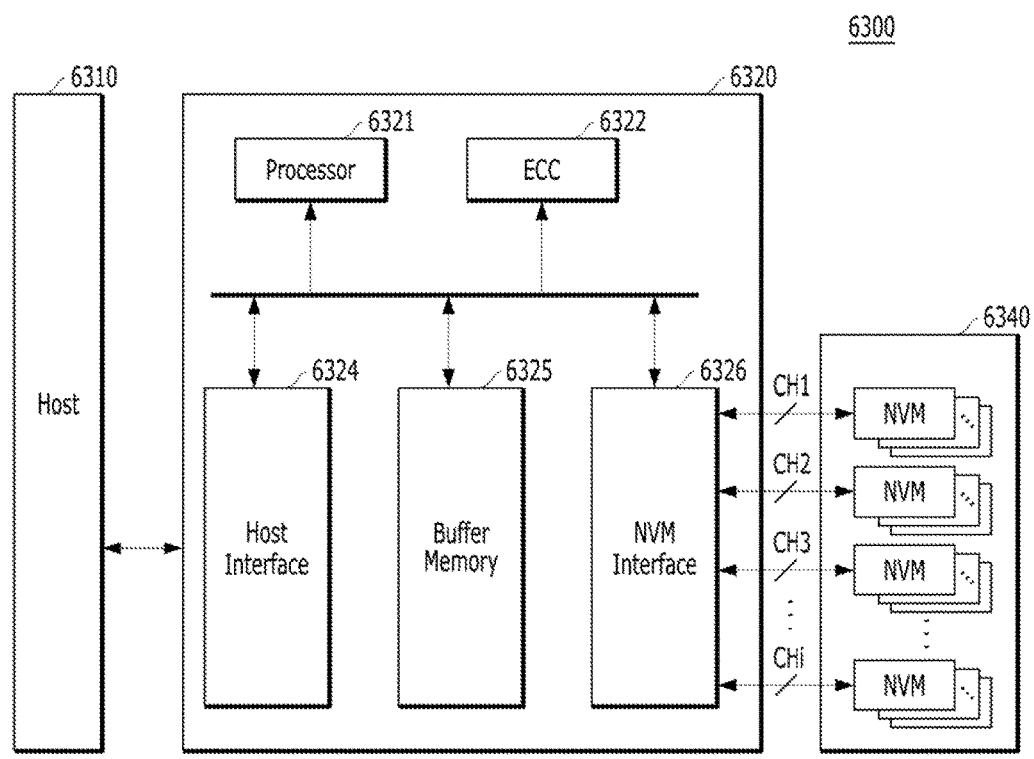

FIG. 14 is a diagram illustrating an example of a data processing system including a memory system according to an embodiment of the invention. For example, in FIG. 14, a solid state drive (SSD) 6300 employing a memory system is shown.

Referring to FIG. 14, the SSD 6300 may include a memory device 6340 which may include a plurality of nonvolatile memories NVM, and a controller 6320. The controller 6320 may correspond to the controller 130 in the memory system 110 described above with reference to FIG. 1. The memory device 6340 may correspond to the memory device 150 in the memory system 110 described above with reference to FIG. 1.

The controller 6320 may be connected with the memory device 6340 through a plurality of channels CH1, CH2, CH3, . . . , and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 may temporarily store data received from a host 6310 or data received from a plurality of nonvolatile memories NVMs included in the memory device 6340, or temporarily store metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 10, for the sake of convenience in explanation, that the buffer memory 6325 is disposed inside the controller 6320, it is to be noted that the buffer memory 6325 may be disposed outside the controller 6320.

The ECC circuit 6322 may calculate error correction code values of data to be programmed in the memory device 6340 in a program operation, perform an error correction operation for data read from the memory device 6340, based on the error correction code values, in a read operation, and perform an error correction operation for data recovered from the memory device 6340 in a recovery operation for failed data.

The host interface 6324 may provide an interface function with respect to an external device such as the host 6310, The nonvolatile memory interface 6326 may provide an interface function with respect to the memory device 6340 which is connected through the plurality of channels CH1, CH2, CH3, . . . , and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 15:
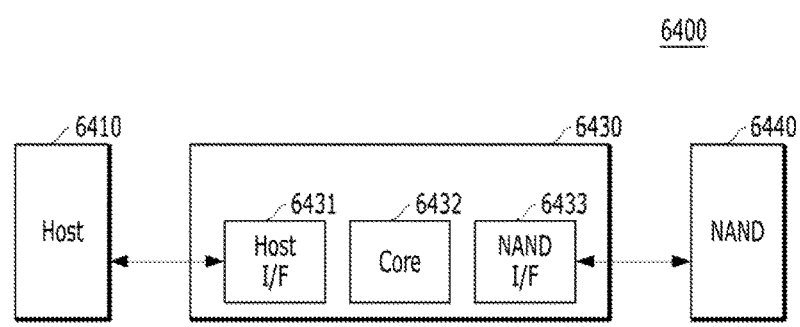

FIG. 15 is a diagram illustrating another example of a data processing system including the memory system according to an embodiment of the present invention. For example, in FIG. 15, an embedded multimedia card (eMMC) 6400 is shown.

Referring to FIG. 15, the eMMC 6400 may include a memory device 6440 which is implemented with at least one NAND flash memory, and a controller 6430. The controller 6430 may correspond to the controller 130 in the memory system 110 described above with reference to FIG. 1. The memory device 6440 may correspond to the memory device 150 in the memory system 110 described above with reference to FIG. 1.

The controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 16:
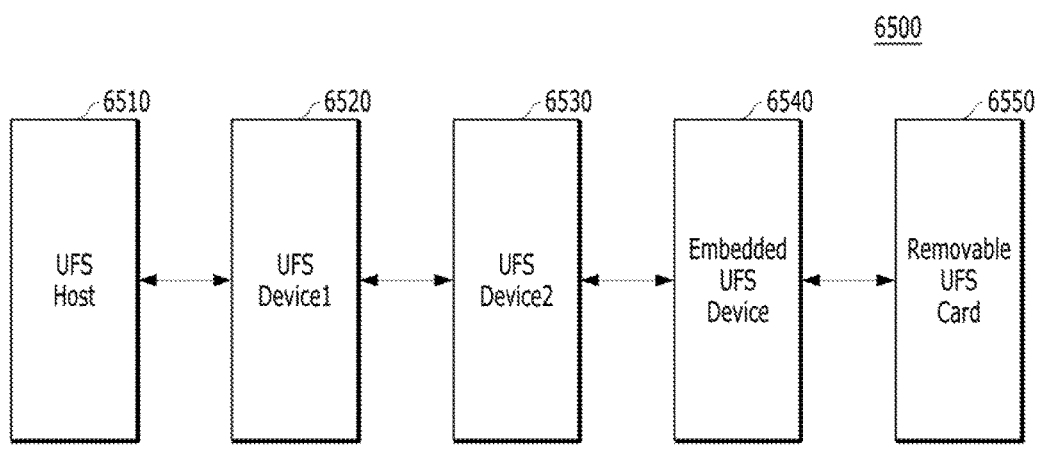

FIG. 16 is a diagram illustrating another example of a data processing system including a memory system according to an embodiment of the present invention. For example, FIG. 16 illustrates a universal flash storage (UFS) 6500 employing the memory system according to an embodiment of the present invention.

Referring to FIG. 16, the UFS system 6500 may include a UFS host 6510, a plurality of UFS devices 6520 and 6530, an embedded UFS device 6540, and a removable UFS card 6550. The UFS host 6510 may be an application processor of wired and/or wireless electronic appliances, for example, a mobile electronic appliance.

The UFS host 6510, the UFS devices 6520 and 6530, the embedded UFS device 6540 and the removable UFS card 6550 may respectively communicate with external devices such as wired and/or wireless electronic appliances (for example, a mobile electronic appliance), for example, through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 12. The embedded UFS device 6540 and the removable UFS card 6550 may also communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 17:
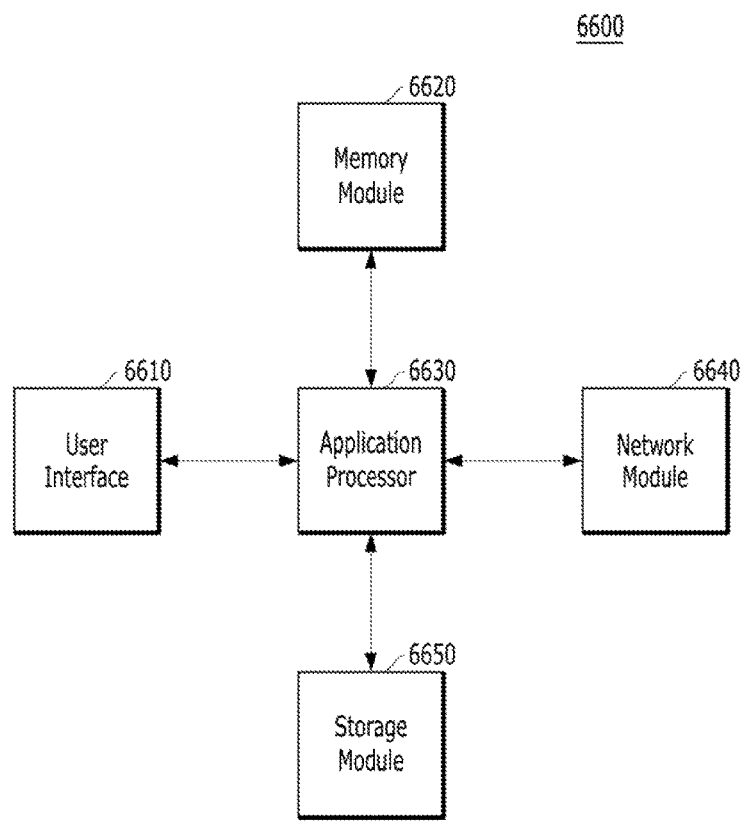

FIG. 17 is a diagram illustrating an example of a data processing system including the memory system according to an embodiment of the present invention. For example, in FIG. 17, a user system 6600 employing the memory system according to an embodiment of the present invention is shown.

Referring to FIG. 17, the user system 6600 may include a user interface 6610, a memory module 6620, an application processor 6630, a network module 6640, and a storage module 6650.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired and/or wireless electronic appliances, for example, a mobile electronic appliance. According to this fact, the memory system and the data processing system according to the embodiment may be applied to wired and/or wireless electronic appliances. The network module 6640 may be included in the application processor 6630.

The storage module 6650 may store data, for example, data received from the application processor 6630, and transmit data stored therein, to the application processor 6630. The storage module 6650 may be implemented by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 14 to 16.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED) a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired and/or wireless communication with an external device, as described above. The user interface 6610 as the display/touch module of the mobile electronic appliance displays data processed by the application processor 6630 or supports input of data from a touch panel.

Although various embodiments of the present invention have been described for illustrative purposes, it will be apparent to those skilled in the art that various other changes and modifications may be made without departing from the spirit and scope of the invention as defined in the following claims.

What is claimed is:

1. An apparatus for controlling a memory device, comprising:
   a table storing information of a plurality of read voltages;
   a voltage supply generating the plurality of read voltages;
   an error correction unit correcting an error of read data; and
   a processor functionally coupled to the table and the error correction unit to perform a read retry operation,
   wherein the processor is configured to select a default read voltage among the plurality of read voltages from the table when a read fail for the memory device is recognized, use the default read voltage to read cells of the memory device, set a shift direction of the default read voltage based on a count of read cells for determining a next read voltage in the table, and use the next read voltage to read the cells of the memory device for the read retry operation.

2. The apparatus of claim 1, wherein the processor sets the shift direction of the default read voltage to a positive direction when the number of read cells is smaller than a reference cell number, and sets the shift direction of the default read voltage to a negative direction when the number of read cells is equal to or larger than the reference cell number.

3. The apparatus of claim 2, wherein when the shift direction is set to the positive direction, the processor controls the read retry operation of the memory device while sequentially selecting read voltages in the positive direction in the table.

4. The apparatus of claim 3, wherein when the shift direction is set to the negative direction, the processor controls the read retry operation of the memory device while sequentially selecting read voltages in the negative direction in the table.

5. The apparatus of claim 4, wherein the error correction unit corrects an error of data read from the memory device through the read retry operation, and
   when the error correction of the error correction unit is normally performed, the processor sets the corresponding read voltage to a read voltage of the memory device.

6. The apparatus of claim 2, wherein the table stores read voltages of single level cells (SLCs), and
   the processor selects a default read voltage R1 among default read voltages R1 to R7 stored in the table when the read fail is recognized, and sets the shift direction of the default read voltage R1 by analyzing the number of erased cells read from the memory device based on the default read voltage R1.

7. The apparatus of claim 2, wherein the table stores read voltages of multi-level cells (MLCs), and
   when the read fail is recognized, the processor analyzes a page type in the memory device, and selects a default read voltage of the analyzed page type in the table.

8. The apparatus of claim 7, wherein when the page type is a least significant bit (LSB) type, the processor selects a default read voltage R1 and/or R3 among default read voltages R1 to R7 stored in the table, and sets the shift direction of the default read voltages R1 and R3 by analyzing the number of LSB cells read from the memory device based on the default read voltage R1 and/or R3, and
   when the page type is a most significant bit (MSB) type, the processor selects a default read voltage R2 in the table, and sets the shift direction of the default read voltage R2 by analyzing the number of MSB cells read from the memory device based on the default read voltage R2.

9. The apparatus of claim 2, wherein the RR table stores read voltages of triple level cells (TLCs), and
   when the read fail is recognized, the processor analyzes a page type in the memory device, and selects a default read voltage of the analyzed page type in the table.

10. The apparatus of claim 9, wherein when the page type is a least significant bit (LSB) type, the processor selects a default read voltage R3 and/or R7 among default read voltages R1 to R7 stored in the table, and sets the shift direction of the default read voltages R3 and R7 by analyzing the number of LSB cells read from the memory device based on the default read voltage R3 and/or R7,
   when the page type is a center significant bit (CSB) type, the processor selects a default read voltage R2, R4 and/or R6 in the table, and sets the shift direction of the default read voltages R2, R4 and R6 by analyzing the number of CSB cells read from the memory device based on the default read voltage R2, R4 and/or R6, and
   when the page type is a most significant bit (MSB) type, the processor selects a default read voltage R1 and/or R5 in the table, and sets the shift direction of the default read voltages R1 and R5 by analyzing the number of MSB cells read from the memory device based on the default read voltage R1 and/or R5.

11. A method for controlling a memory device, comprising:
   selecting a default read voltage from a table storing information of a plurality of read voltages when a read fail for the memory device is recognized;
   generating and using the default read voltage to read cells of the memory device;
   setting a shift direction of the default read voltage based on a count of read cells for determining a next read voltage in the table; and
   generating and using the next read voltage to read the cells of the memory device for the read retry operation.

12. The method of claim 11, wherein the setting of the shift direction of the default read voltage comprises:
   comparing the number of read cells to a reference cell number, based on the default read voltage;
   setting the shift direction of the default read voltage to a positive direction when the number of read cells is smaller than the reference cell number; and
   setting the shift direction of the default read voltage to a negative direction when the number of read cells is equal to or larger than the reference cell number.

13. The method of claim 12, wherein the controlling of the read retry operation comprises controlling the read retry operation of the memory device while sequentially selecting read voltages in the positive direction in the table, when the shift direction of the default read voltage is set to the positive direction.

14. The method of claim 13, wherein the controlling of the read retry operation comprises controlling the read retry operation of the memory device while sequentially selecting read voltages in the negative direction in the table, when the shift direction of the default read voltage is set to the negative direction.

15. The method of claim 14, wherein the controlling of the read retry operation comprises:
correcting an error of data read from the memory device; and
setting the corresponding read voltage to a read voltage of the memory device when the error correction is normally performed.

16. The method of claim 11, wherein the table stores read voltages of single level cells (SLCs), and
wherein the selecting of the default read voltage of the table comprises selecting a default read voltage R1 among default read voltages R1 to R7 stored in the table when a read fail is recognized, and
the setting of the shift direction of the reference read voltage comprises setting the shift direction of the default read voltage by analyzing the number of erased cells read from the memory device based on the default read voltage R1.

17. The method of claim 11, wherein the table stores read voltages of multi-level cells (MLCs), and
the selecting of the default read voltage of the table comprises:
analyzing a page type in the memory device when the read fail is recognized; and
selecting a default read voltage of the analyzed page type in the table.

18. The method of claim 17, wherein the setting of the shift direction of the default read voltage comprises:
selecting a default read voltage R1 and/or R3 among default read voltages R1 to R7 stored in the table when the page type is a least significant bit (LSB) type, and setting the shift direction of the default read voltages R1 and R3 by analyzing the number of LSB cells read from the memory device based on the default read voltage R1 and/or R3; and
selecting a default read voltage R2 in the table when the page type is a most significant bit (MSB) type, and setting the shift direction of the default read voltage R2 by analyzing the number of MSB cells read from the memory device based on the default read voltage R2.

19. The method of claim 11, wherein the table stores read voltages of triple level cells (TLCs), and
the selecting of the default read voltage of the table comprises:
analyzing a page type in the memory device when the read fail is recognized; and
selecting a default read voltage of the analyzed page type in the table.

20. The method of claim 19, wherein the setting of the shift direction of the default read voltage comprises:
selecting a default read voltage R3 and/or R7 among default read voltages R1 to R7 stored in the table when the page type is a least significant bit (LSB) type, and setting the shift direction of the default read voltages R3 and R7 by analyzing the number of LSB cells read from the memory device based on the default read voltage R3 and/or R7;
selecting a default read voltage R2, R4 and/or R6 in the table when the page type is a center significant bit (CSB) type, and setting the shift direction of the default read voltages R2, R4 and R6 by analyzing the number of CSB cells read from the memory device based on the default read voltage R2, R4 and/or R6; and
selecting a default read voltage R1 and/or R5 in the table when the page type is a most significant bit (MSB) type, and setting the shift direction of the default read voltages R1 and R5 by analyzing the number of MSB cells read from the memory device based on the default read voltage R1 and/or R5.

* * * * *